(12) United States Patent
Ummethala et al.

(10) Patent No.: US 8,724,115 B2
(45) Date of Patent: May 13, 2014

(54) LINEAR STAGE AND METROLOGY ARCHITECTURE FOR REFLECTIVE ELECTRON BEAM LITHOGRAPHY

(71) Applicant: KLA-Tencor Corporation, Milpitas, CA (US)

(72) Inventors: Upendra Ummethala, Cupertino, CA (US); Layton Hale, Castro Valley, CA (US); Josh Clyne, Sunnyvale, CA (US); Samir Nayfeh, Shrewsbury, MA (US); Mark Williams, Beaufort, SC (US); Joseph A. DiRegolo, Livermore, CA (US); Andrew Wilson, Forest Hills, NY (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/914,351

(22) Filed: Jun. 10, 2013

(65) Prior Publication Data
US 2013/0342827 A1 Dec. 26, 2013

Related U.S. Application Data

(63) Continuation-in-part of application No. 13/824,079, filed as application No. PCT/US2012/053927 on Sep. 6, 2012.

(60) Provisional application No. 61/658,745, filed on Jun. 12, 2012, provisional application No. 61/531,509, filed on Sep. 6, 2011.

(51) Int. Cl.
*G01B 11/02* (2006.01)

(52) U.S. Cl.
CPC ..................................... *G01B 11/02* (2013.01)
USPC .......................................... 356/500; 356/508

(58) Field of Classification Search
USPC ...................... 250/442.11; 356/500, 508, 498
See application file for complete search history.

(56) References Cited

U.S. PATENT DOCUMENTS 5,114,234 A * 5/1992 Otsuka et al. ................. 356/500
5,790,253 A * 8/1998 Kamiya ........................ 356/500
(Continued)

FOREIGN PATENT DOCUMENTS

| JP | 2004207738 A | 7/2004 |
| JP | 2008306140 A | 12/2008 |

OTHER PUBLICATIONS

Heertjes et al. Hybrid Control for Motion Systems with Improved Disturbance Rejection. 2008. [retrieved on Nov. 9, 2012]. Retrieved from the Internet: <http://libra.msra.cn/Publications/5332087/hybrid-control-for-motion-systems-with-improved -disturbance-rejection>. 7 pages.

(Continued)

*Primary Examiner* — Kiet T Nguyen
(74) *Attorney, Agent, or Firm* — Suiter Swantz pc llo

(57) ABSTRACT

A stage metrology suitable for REBL includes an interferometer stage metrology system configured to measure the position and rotation of a short-stroke wafer scanning stage, wherein the interferometer metrology system includes two or more interferometers for each axis of measurement, wherein a first interferometer mirror is disposed on a first surface of the short-stroke wafer scanning stage and a second interferometer mirror is disposed on a second surface of the short-stroke wafer scanning stage, and a control system configured to determine a shape error for the first interferometer mirror using two or more interferometer measurements from the two or more interferometers associated with the first interferometer mirror and a shape error for the second interferometer mirror using two or more interferometer measurements from the two or more interferometers associated with the second interferometer mirror.

30 Claims, 21 Drawing Sheets

(56) References Cited

U.S. PATENT DOCUMENTS

| | | | |
|---|---|---|---|
| 5,969,441 A | 10/1999 | Loopstra et al. | |
| 6,089,525 A | 7/2000 | Williams | |
| 6,408,045 B1 | 6/2002 | Matsui et al. | |
| 6,469,773 B1 | 10/2002 | Iwamoto | |
| 7,495,771 B2 * | 2/2009 | Akimoto | 356/500 |
| 2008/0137090 A1 | 6/2008 | Hetzler et al. | |
| 2008/0142733 A1 | 6/2008 | Zywno et al. | |
| 2008/0304064 A1 | 12/2008 | Kurosawa | |
| 2010/0149548 A1 | 6/2010 | Shmarev et al. | |

OTHER PUBLICATIONS

Freed et al. Demonstration of Lithography Patterns Using Reflective E-Beam Direct Write. Apr. 4, 2011. [retrieved on Nov. 9, 2012]. Retrieved from the Internet: <http://proceedings.spiedigitallibrary.org/proceeding.aspx?articleid=727590>. 2 pages.

* cited by examiner

720

722 — RECEIVING A FIRST SET OF INTERFEROMETER MEASUREMENTS FROM TWO OR MORE INTERFEROMETERS ASSOCIATED WITH A FIRST INTERFEROMETER MIRROR OF THE SHORT-STROKE WAFER SCANNING STAGE OF AN UPPER FAST STAGE OF A STACKED STAGE WAFER ACTUATION SYSTEM

724 — RECEIVING A SECOND SET OF INTERFEROMETER MEASUREMENTS FROM TWO OR MORE INTERFEROMETERS ASSOCIATED WITH A SECOND INTERFEROMETER MIRROR OF THE SHORT-STROKE WAFER SCANNING STAGE OF THE UPPER FAST STAGE OF THE STACKED STAGE WAFER ACTUATION SYSTEM

726 — STITCHING TOGETHER A FIRST INTERFEROMETER MEASUREMENT AND AT LEAST AN ADDITIONAL INTERFEROMETER MEASUREMENT OF THE FIRST SET OF INTERFEROMETER MEASUREMENTS ASSOCIATED WITH THE FIRST INTERFEROMETER MIRROR

728 — STITCHING TOGETHER A FIRST INTERFEROMETER MEASUREMENT AND AT LEAST AN ADDITIONAL INTERFEROMETER MEASUREMENT OF THE SECOND SET OF INTERFEROMETER MEASUREMENTS ASSOCIATED WITH THE SECOND INTERFEROMETER MIRROR

FIG.7B

LINEAR STAGE AND METROLOGY ARCHITECTURE FOR REFLECTIVE ELECTRON BEAM LITHOGRAPHY

CROSS-REFERENCE TO RELATED APPLICATION

For purposes of the USPTO extra-statutory requirements, the present application claims priority to U.S. patent application Ser. No. 13/824,079, entitled LINEAR STAGE FOR REFLECTIVE ELECTRON BEAM LITHOGRAPHY, filed Mar. 13, 2013, naming Upendra Ummethala, Layton Hale, Joshua Clyne, Samir Nayfeh, Mark Williams, Joe DiRegolo and Andrew Wilson as inventors, which constitutes a national stage application of PCT/US2012/53927, filed Sep. 6, 2012, entitled LINEAR STAGE FOR REFLECTIVE ELECTRON BEAM LITHOGRAPHY, naming Upendra Ummethala, Layton Hale, Joshua Clyne, Samir Nayfeh, Mark Williams, Joe DiRegolo and Andrew Wilson as inventors, which claims priority to U.S. Provisional Patent Application 61/531,509, entitled REBL LINEAR STAGE BASED SYSTEM ARCHITECTURE, filed on Sep. 6, 2011, naming Upendra Ummethala as inventor. The present application further claims priority to U.S. Provisional Patent Application 61/658,745, entitled LINEAR STAGE AND METROLOGY ARCHITECTURE FOR REFLECTIVE ELECTRON BEAM LITHOGRAPHY, naming Upendra Ummethala, Layton Hale, Joshua Clyne, Samir Nayfeh, Mark Williams, Joe DiRegolo and Andrew Wilson as inventors, filed Jun. 12, 2012. Each of the aforementioned applications is incorporated herein by reference in the entirety.

GOVERNMENT LICENSE RIGHTS

The U.S. Government has a paid-up license in this invention and the right in limited circumstances to require the patent owner to license others on reasonable terms as provided for by the terms of Contract No. HR0011-07-9-0007 awarded by the Defense Advanced Research Projects Agency.

TECHNICAL FIELD

The present invention generally relates to reflective electron beam lithography, and more particularly to linear stacked stage suitable for use in a reflective electron beam lithography system.

BACKGROUND

A lithographic process includes the patterned exposure of a resist allowing portions of the resist to be selectively removed, thereby exposing underlying areas for selective processing, such as etching, material deposition, ion implantation and the like. Typically, lithographic processes utilize ultraviolet light for selective exposure of the resist. In addition, charged particle beams (e.g., electron beams) have been used for high resolution lithographic resist exposure. The use of e-beam based lithography systems allows for relatively accurate control of the electron beam at relatively low power and relatively high speed. Electron beam lithographic systems may include s electron-beam direct write (EBDW) lithography systems and electron beam projection lithography systems.

In EBDW lithography, the substrate (e.g., semiconductor wafer) is sequentially exposed by a focused electron beam, whereby the beam is scanned over the whole wafer and the desired structure is written on the wafer by corresponding blanking of the beam. Alternatively, in a vector scan method, the focused electron beam is guided over the regions to be exposed. The beam spot may be shaped by a diaphragm. Scanning e-beam lithography is distinguished by high flexibility, since the circuit geometries are stored in a computer and can be optionally varied. Furthermore, very high resolutions can be attained by electron beam writing, since electron foci, with small diameters, may be attained with electron-optical imaging systems. However, it is disadvantageous in that the process is time-consuming, due to the sequential, point-wise writing. Scanning e-beam lithography is therefore at present mainly used for the production of the masks used in projection lithography. It would therefore be advantageous to provide a EBDW lithography system with improved throughput. The present invention seeks to cure the deficiencies of the prior art.

SUMMARY

An interferometer stage metrology system with interferometer mirror shape error recovery is disclosed. In a first aspect, the interferometer stage metrology system may include, but is not limited to, an interferometer stage metrology system configured to interferometrically measure the position of a short-stroke wafer scanning stage of on an upper fast stage of a stacked stage wafer actuation system along at least one of a first axis, a second axis and a third axis, wherein the interferometer stage metrology system is further configured to interferometrically measure rotation of the short-stroke wafer scanning stage about at least one of the first axis, the second axis and the third axis, wherein the interferometer metrology system includes two or more interferometers for each axis, wherein a first interferometer mirror is disposed on a first surface of the short-stroke wafer scanning stage and a second interferometer mirror is disposed on a second surface of the short-stroke wafer scanning stage; and a control system communicatively coupled to each of the interferometers of the interferometer metrology system, wherein the control system is configured to determine a shape error for the first interferometer mirror using two or more interferometer measurements from the two or more interferometers associated with the first interferometer mirror and a shape error for the second interferometer mirror using two or more interferometer measurements from the two or more interferometers associated with the second interferometer mirror.

An interferometer stage metrology system with interferometry measurement stitching is disclosed. In one aspect, interferometer stage metrology system may include, but is not limited to, an interferometer stage metrology system configured to interferometrically measure the position of a short-stroke wafer scanning stage of on an upper stage of a stacked stage wafer actuation system along at least one of a first axis, a second axis and a third axis, wherein the interferometer stage metrology system is further configured to interferometrically measure rotation of the short-stroke wafer scanning stage about at least one of the first axis, the second axis and the third axis, wherein the interferometer metrology system includes two or more interferometers for each axis, wherein a first interferometer mirror is disposed on a first surface of the short-stroke wafer scanning stage and a second interferometer mirror is disposed on a second surface of the short-stroke wafer scanning stage; and a control system communicatively coupled to each of the interferometers of the interferometer metrology system, wherein the control system is configured to stitch together measurements from two or more interferometers associated with the first interferometer mirror and stitch together measurements from two or more interferometers associated with the second interferometer mirror.

An interferometer stage metrology system with electron beam and wafer alignment capabilities. In one aspect, interferometer stage metrology system may include, but is not limited to, an interferometer stage metrology system configured to interferometrically measure the position of a short-stroke wafer scanning stage of on an upper fast stage of a stacked stage wafer actuation system along at least one of a first axis, a second axis and a third axis, wherein the interferometer stage metrology system is further configured to interferometrically measure rotation of the short-stroke wafer scanning stage about at least one of the first axis, the second axis and the third axis, wherein the interferometer metrology system includes two or more interferometers for each axis, wherein a first interferometer mirror is disposed on a first surface of the short-stroke wafer scanning stage and a second interferometer mirror is disposed on a second surface of the short-stroke wafer scanning stage; one or more electron beam alignment sensors disposed on the short-stroke wafer scanning stage of the upper fast stage; one or more wafer alignment sensors disposed on the short-stroke wafer scanning stage of the upper fast stage; a control system communicatively coupled to the one or more electron beam alignment sensors, the one or more wafer alignment sensors and the interferometer metrology system, the control system further configured to: determine the position of the electron beam relative to the two or more interferometers of the interferometer metrology system via timing control between one or more interferometry measurements of the interferometer stage metrology system and the one or more electron beam alignment sensors; determine a position of a wafer disposed on the short-stroke wafer scanning stage relative to the one or more electron beam alignment sensors via timing control between the one or more wafer alignment sensors and the interferometer metrology system; and determine a position of the electron beam relative to a wafer disposed on the short-stroke wafer scanning stage based on the determined position of the electron beam relative to the two or more interferometers of the interferometer metrology system and the position of the wafer relative to the one or more electron beam alignment sensors.

A method for shape error recovery of interferometer mirrors of an interferometry based metrology system of a short-stroke wafer scanning stage of a reflective electron beam lithography tool is disclosed. In one aspect, the method may include, but is not limited to, receiving a first set of interferometer measurements from two or more interferometers associated with a first interferometer mirror of the short-stroke wafer scanning stage of an upper fast stage of a stacked stage wafer actuation system; receiving a second set of interferometer measurements from two or more interferometers associated with a second interferometer mirror of the short-stroke wafer scanning stage of the upper fast stage of the stacked stage wafer actuation system; determining a first shape error for the first interferometer mirror using the first set of interferometer measurements from the two or more interferometers associated with the first interferometer mirror; and determining a second shape error for the second interferometer mirror using the second set of interferometer measurements from the two or more interferometers associated with the second interferometer mirror.

A method for interferometry measurement stitching in an interferometry based metrology system of a short-stroke wafer scanning stage of a reflective electron beam lithography tool is disclosed. In one aspect, the method may include, but is not limited to, receiving a first set of interferometer measurements from two or more interferometers associated with a first interferometer mirror of the short-stroke wafer scanning stage of an upper fast stage of a stacked stage wafer actuation system; receiving a second set of interferometer measurements from two or more interferometers associated with a second interferometer mirror of the short-stroke wafer scanning stage of the upper fast stage of the stacked stage wafer actuation system; stitching together a first interferometer measurement and at least an additional interferometer measurement of the first set of interferometer measurements associated with the first interferometer mirror; and stitching together a first interferometer measurement and at least an additional interferometer measurement of the second set of interferometer measurements associated with the second interferometer mirror.

A method for electron beam alignment with a wafer on a short-stroke wafer scanning stage of a reflective electron beam lithography tool is disclosed. In one aspect, the method may include, but is not limited to, providing one or more electron beam alignment sensors disposed on a short-stroke wafer scanning stage of an upper fast stage of the stacked stage wafer actuation system; providing one or more wafer alignment sensors disposed on the short-stroke wafer scanning stage of the upper fast stage of the stacked stage wafer actuation system; determining a position of an electron beam of a lithography tool relative to two or more interferometers of an interferometer stage metrology system via timing control between one or more interferometry measurements of the interferometer stage metrology system and the one or more electron beam alignment sensors; determining a position of a wafer disposed on the short-stroke wafer scanning stage relative to the one or more electron beam alignment sensors via timing control between the one or more wafer alignment sensors and the interferometer stage metrology system; and determining a position of the electron beam relative to a wafer disposed on the short-stroke wafer scanning stage based on the determined position of the electron beam relative to the two or more interferometers of the interferometer metrology system and the determined position of the wafer relative to the one or more electron beam alignment sensors.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 1D is a schematic view of a single-layer permanent magnetic axial lens array, in accordance with one embodiment of the present invention.

FIG. 7B is a process flow diagram of a method for interferometry measurement stitching in an interferometry based metrology system of a short-stroke wafer scanning stage of a reflective electron beam lithography tool, in accordance with a preferred embodiment of the present invention.

DETAILED DESCRIPTION OF THE INVENTION

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

Referring generally to FIG. 1A through 9, a linear stacked stage suitable for reflective electron beam lithography (REBL) equipped with an interferometry-based stage metrology system is described in accordance with the present disclosure. The present invention is directed toward a linear scanning stage including one or more discrete stage levels suitable for use in a REBL based direct write e-beam lithography machine. In one aspect, the stacked stage assembly of the present invention may include an upper fast stage assembly disposed on top of a carrier stage assembly. Further, the upper fast stage assembly may consist of long-stroke stage assembly (including two or more individual long-stroke stages) and a short-stroke stage assembly (including two or more individual short-stroke stages) disposed on top of the long-stroke assembly. In a further aspect of the present invention, the motion of the individual translating stages of the upper stage assembly may be coordinated such that combined motion acts to cancel out inertial reaction forces generated by their movement. This feature eliminates or reduces the need for sacrificial counter masses commonly needed to reduce the impact of inertial reaction forces caused by the various translating stages of a stage system. In a further aspect of the present invention, the position and rotation of one or more translated wafers (via short-stroke wafer scanning stages described further herein) may be monitored utilized a multiple interferometer stage metrology system. While the majority of the present disclosure focuses on the implementation of the stacked stage assembly and the monitoring of the position and rotation of the wafers actuated by the stage assembly in the context of direct write e-beam lithography, it is recognized that the present invention may be extended to additional electron optical systems such as e-beam based wafer inspection systems.

Figure 1:
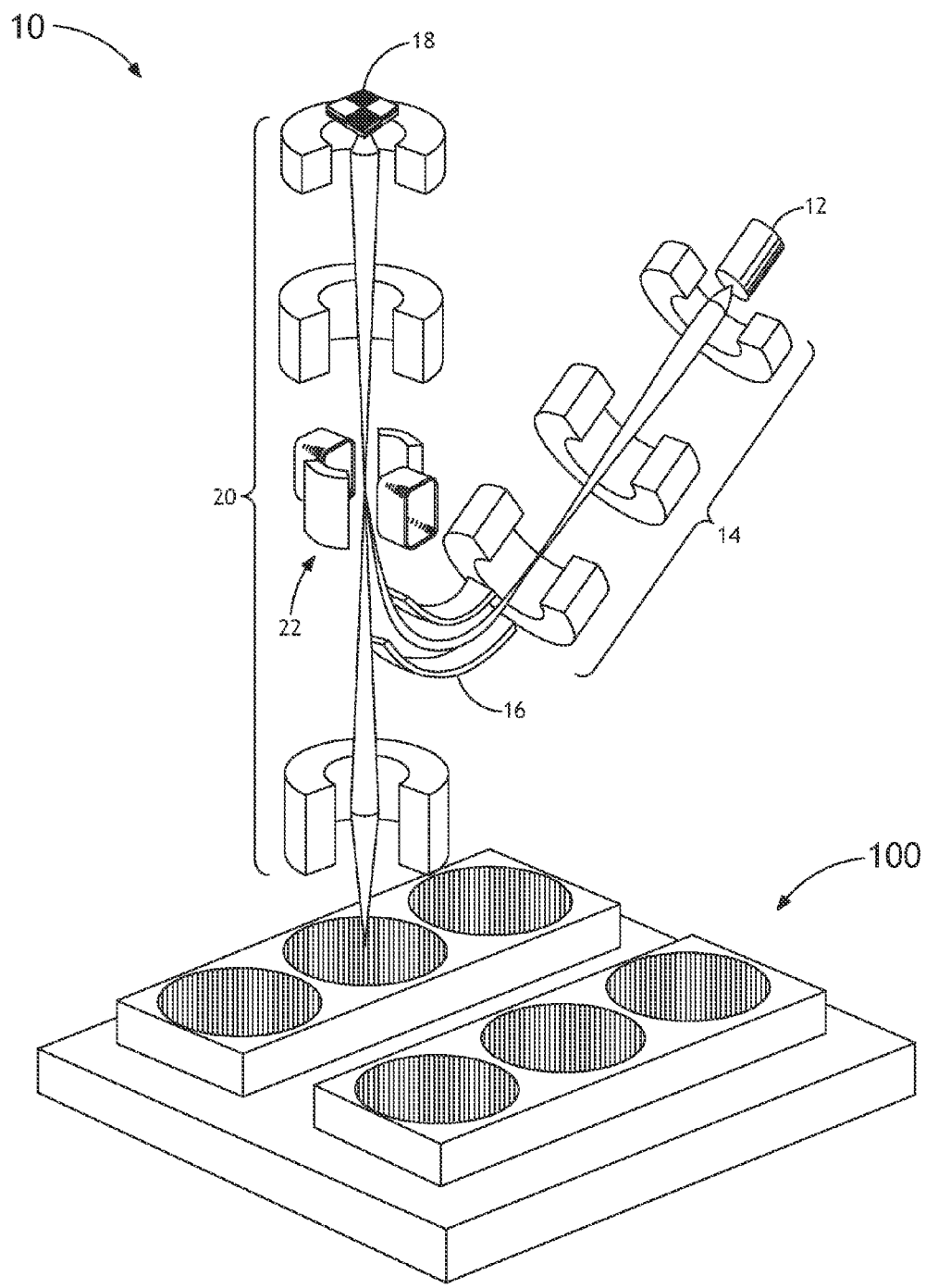
FIG. 1 is a schematic view of a reflective electron beam lithography (REBL) system, in accordance with one embodiment of the present invention.

FIG. 1 illustrates a simplified schematic view of a REBL system 10, in accordance with one embodiment of the present invention. The REBL system 10 may include an electron gun 12, a set of illumination optics 14, and an e-beam bender 16, which together act to direct an illumination beam onto a digital pattern generator (DPG) chip 18. The DPG chip 18 is used for generating patterns on the wafer, whereby the programmed pattern of the DPG chip 18 is scanned across one or more wafers disposed on the linear stacked stage 100. Projection optics 20 are utilized to direct a projection e-beam from the surface of the DPG chip 18 onto the surface of the one or more wafers. The projection optics 20 may include an ExB filter 22 (e.g., Wien Filter) consisting of crossed electrostatic and magnetic deflection fields suitable for separating the projection beam from the illumination beam. The remainder of this disclosure will focus on various aspects of the linear stacked stage system 100.

Figure 2A:
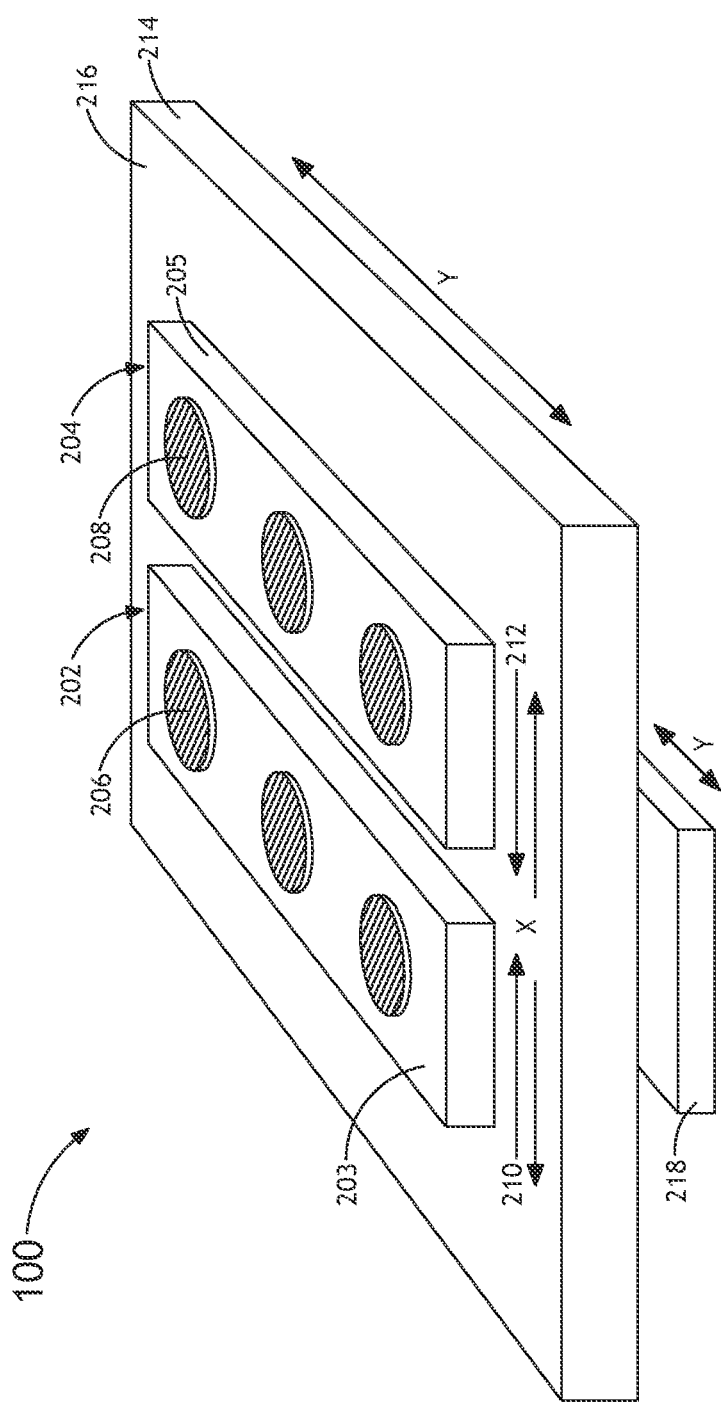
FIG. 2A is a high level schematic view of a linear stacked scanning stage, in accordance with one embodiment of the present invention.
Figure 2B:
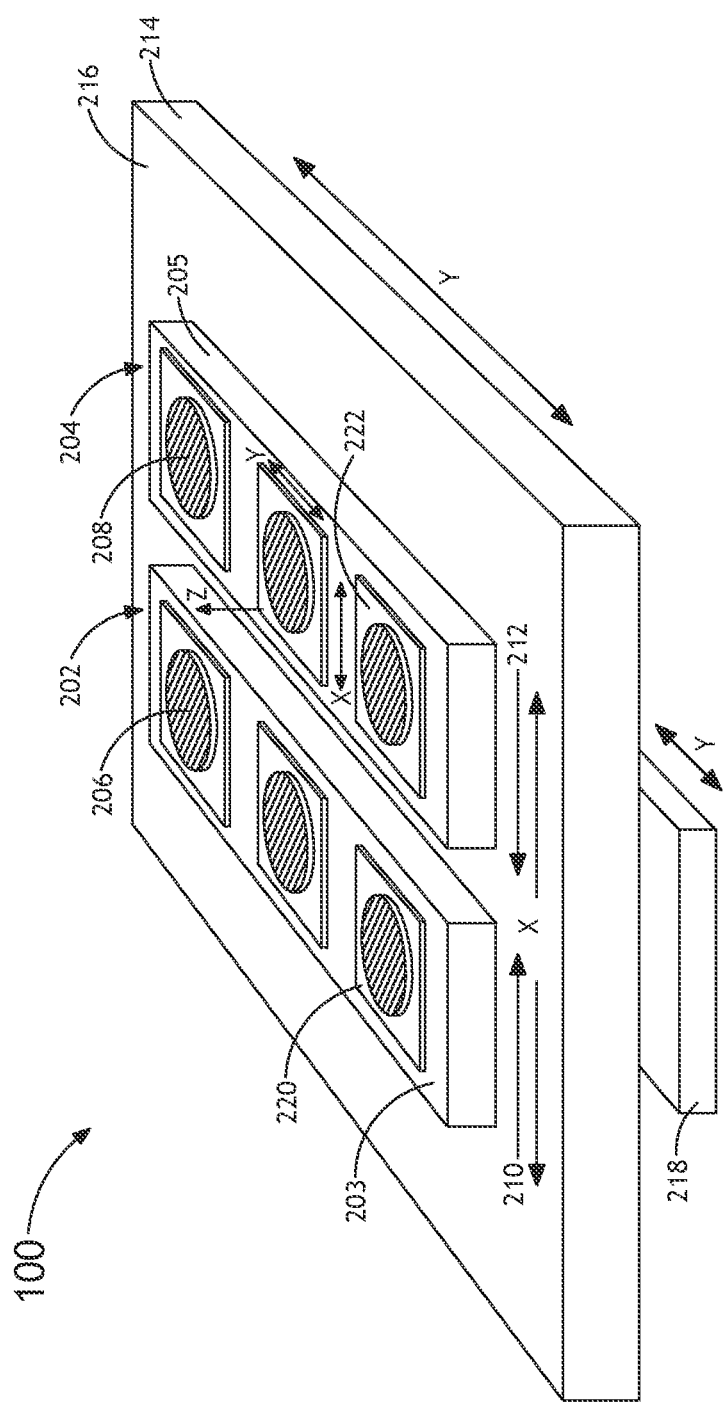
FIG. 2B is a high level schematic view of a linear stacked scanning stage, in accordance with one embodiment of the present invention.

FIGS. 2A and 2B illustrate a high level schematic view of a linear stacked wafer stage, in accordance with the present invention. The stacked wafer stage 100 includes a first upper fast stage 202 and a second upper fast stage 204 disposed on the surface 216 of a carrier stage 214. Each of the upper fast stages 202, 204 is configured to secure and translate a set of wafers 206, 208 (e.g., semiconductor wafers). In this regard, the first upper fast stage 202 is configured to secure and translate a first set of wafers 206, while the second upper stage 204 is configured to secure and translate a second set of wafers 206. In a further aspect, the upper fast stages 202 and 204 are translatable in opposite directions along the X-axis, as indicated by arrows 210 and 212. In this sense, the motion of the first upper stage 202 and the second upper stage 204 are coordinated such that the inertial reaction forces generated by the motion of the first upper fast stage 202 and the second upper fast stage 204 are substantially canceled out. In this sense, the first upper fast stage 202 and the second upper fast stage 204 may be thought of as moving "in sync" with one another in order to minimize the inertial reaction forces experienced by the rest of the supporting system.

In an additional aspect, the carrier stage 214, which carriers the first upper fast stage 202 and the second upper fast stage 204, is configured to translate the first upper fast stage 202 and the first upper fast stage 204 along the Y-axis (perpendicular to the X-axis), as indicated in FIG. 2A. Applicant notes herein that for the purposes of the present disclosure the X-axis, Y-axis, Z-axis are used to generically indicate a first axis, a second axis, and a third axis which are arranged orthogonal to one another.

It is noted herein that the first upper fast stage 202 and the second upper fast stage 204 are suitable for moving the sets of wafers 206, 208, relative to the e-beam optics, at relatively high linear speeds along the scan direction. For example, the upper stage 202 and 204 may translate the wafers at speeds on the order of 1 m/s. In contrast, the carrier stage 214 may translate the upper stage assembly (i.e., all components disposed on carrier stage) at relatively low speeds along the slow step direction of the system 100.

In a further aspect of the present invention, each of the upper fast stages 202, 204 may include a long-stroke scanning stage. For example, the first upper fast stage 202 may include a first long-stroke scanning stage 203, while the second upper fast stage 204 may include a second long-stroke scanning stage 205. In a further embodiment, each of the long-stroke scanning stages 203, 205 may include a magnetic levitation, or "maglev," stage. For example, the long-stroke stages 203, 205 of the upper fast stages 202, 204 may each include a single axis maglev stage. For instance, each long-stroke stage 203, 205 may include a single axis maglev stage suitable for translation along the X-axis. In a further embodiment, the long-stroke stages 203, 205 may include a set of variable reluctance actuators. In another embodiment, each of long-stroke stages 203, 205 of the upper fast stages 202, 204 may include an air bearing stage. For instance, each long-stroke stage 203, 205 may include a single axis air bearing stage suitable for translation along the X-axis. In a further aspect, the long-stroke stages 203, 205 of the stacked stage 100 are suitable for moving the sets of wafers 206, 208, relative to the e-beam optics, at relatively high speeds (e.g., 1 m/s) along the scan direction (e.g., X-direction) of the system 100.

In a further aspect of the present invention, as shown in FIG. 2B, each of the fast upper stages 202, 204 may include a set of short-stroke stages 220, 222. For example, the first fast upper stage 202 may include a first plurality of short-stoke stages 220 disposed on the surface of the long-stroke scanning stage 203 of the first upper stage 202. In addition, the second fast upper stage 204 may include a second plurality of short-stroke stages 222 disposed on the surface of the long-stroke scanning stage 205 of the second upper stage 204. Each short-stroke stage of the first plurality of short-stroke stages 220 may be configured to hold and secure a wafer of the first plurality of wafers 206, while each of the second plurality of short-stroke stages 222 may be configured to secure a wafer of the second plurality of wafers 208.

In one embodiment, the short-stroke stages 220, 222 may include maglev stages configured for actuation along at least one of the X-axis, a Y-axis, and a Z-axis, thereby providing six degrees of translational freedom to each wafer disposed on the given short-stroke stage. In a further embodiment, the short-stroke stages 220, 222 may include maglev stages controlled utilizing Lorentz type motors. In a general sense, the short-stroke stages 220, 222 are configured to provide small position changes to the wafers 206, 208 relative to the E-beam lithography optics (e.g., optics 20 in FIG. 1) allowing for lithography at the 32 nm node at beyond.

In another aspect, the carrier stage 214 may include any slow step stage known in the art. In one embodiment, the carrier stage 214 may include a maglev stage. For example, the carrier stage 214 may include a single axis maglev stage suitable for translation along the Y-axis. In another embodiment, the carrier stage 214 may include an air bearing stage. For instance, the carrier stage 214 may include a single axis air bearing stage suitable for translation along the Y-axis. In yet another embodiment, the carrier stage 214 may include a single axis roller bearing stage. For example, the carrier stage 214 may include a cross-roller stage suitable for translation along the Y-axis. It is further noted that the carrier stage 214 generally translates the first upper stage 202 and the second upper stage 204 at very slow speeds (e.g., slower than 1 m/s) relative to the e-beam lithography optics.

In an additional aspect, the stacked stage 100 may further include a counter mass 218 suitable for countering at least a portion of the inertial forces generated by the motion of the carrier stage or the first upper stage 202 and the second upper stage 204. In one embodiment, the counter mass is configured for translation along the Y-axis. In this regard, the counter mass is configured to move along the Y-axis in a manner (i.e., distance and speed) to substantially counter inertial reaction forces along the Y-direction generated by the motion of the carrier stage 214 and the stages carried on the carrier stage 214.

In another embodiment, the wafers 206, 208 may be secured to the upper fast stages 202 and 204 in any manner known in the art. For instance, the wafers 206, 208 may be mechanically secured to the wafer stages 202, 204 using a set of mechanical chucks (one for each wafer). In another instance, the wafers 206, 208 may be secured to the wafer stages 202, 204 using a set of air chucks (one for each wafer). In yet another instance, the wafers 206, 208 may be secured to the wafer stages 202, 204 using electrostatic chucks (one for each wafer), as will be discussed in greater detail further herein.

Figure 3A:
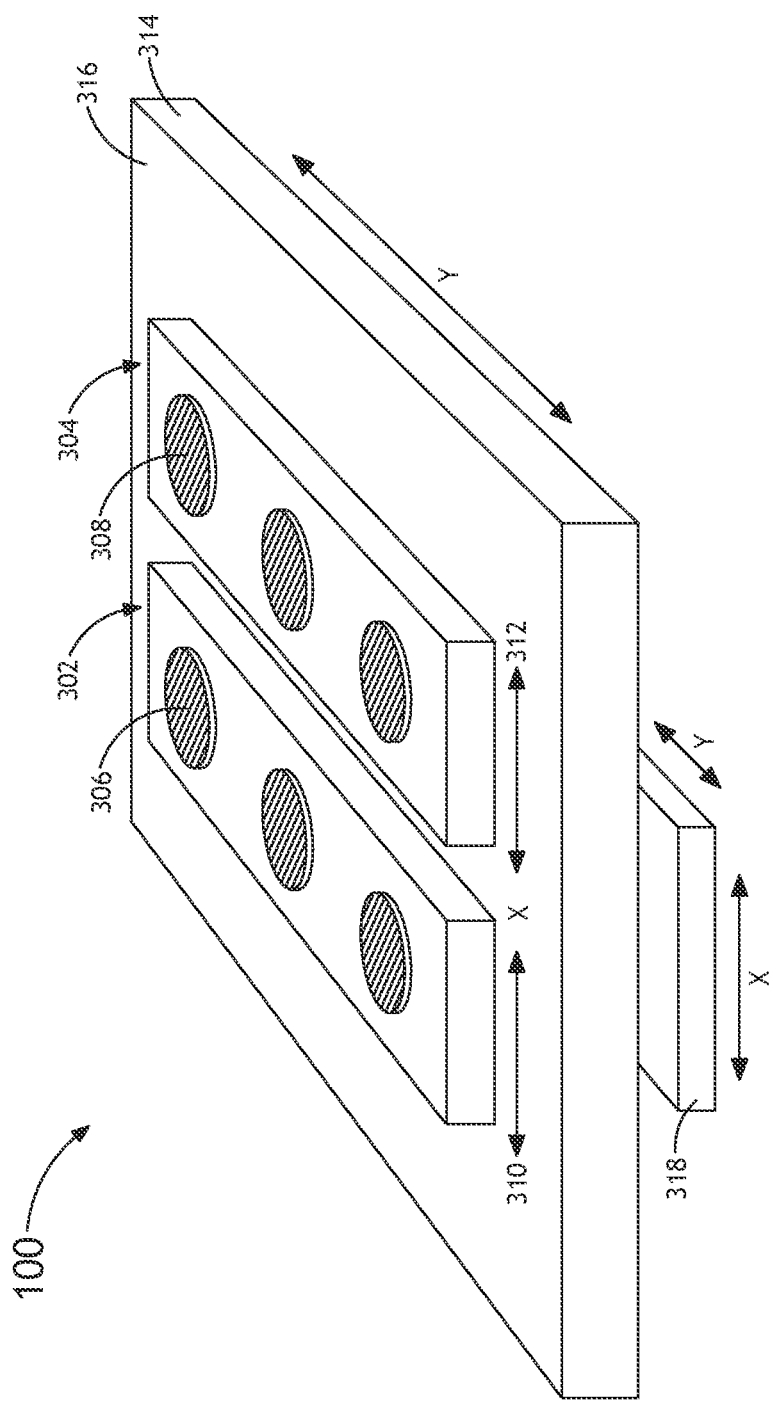
FIG. 3A is a high level schematic view of a linear stacked scanning stage, in accordance with one embodiment of the present invention.
Figure 3B:
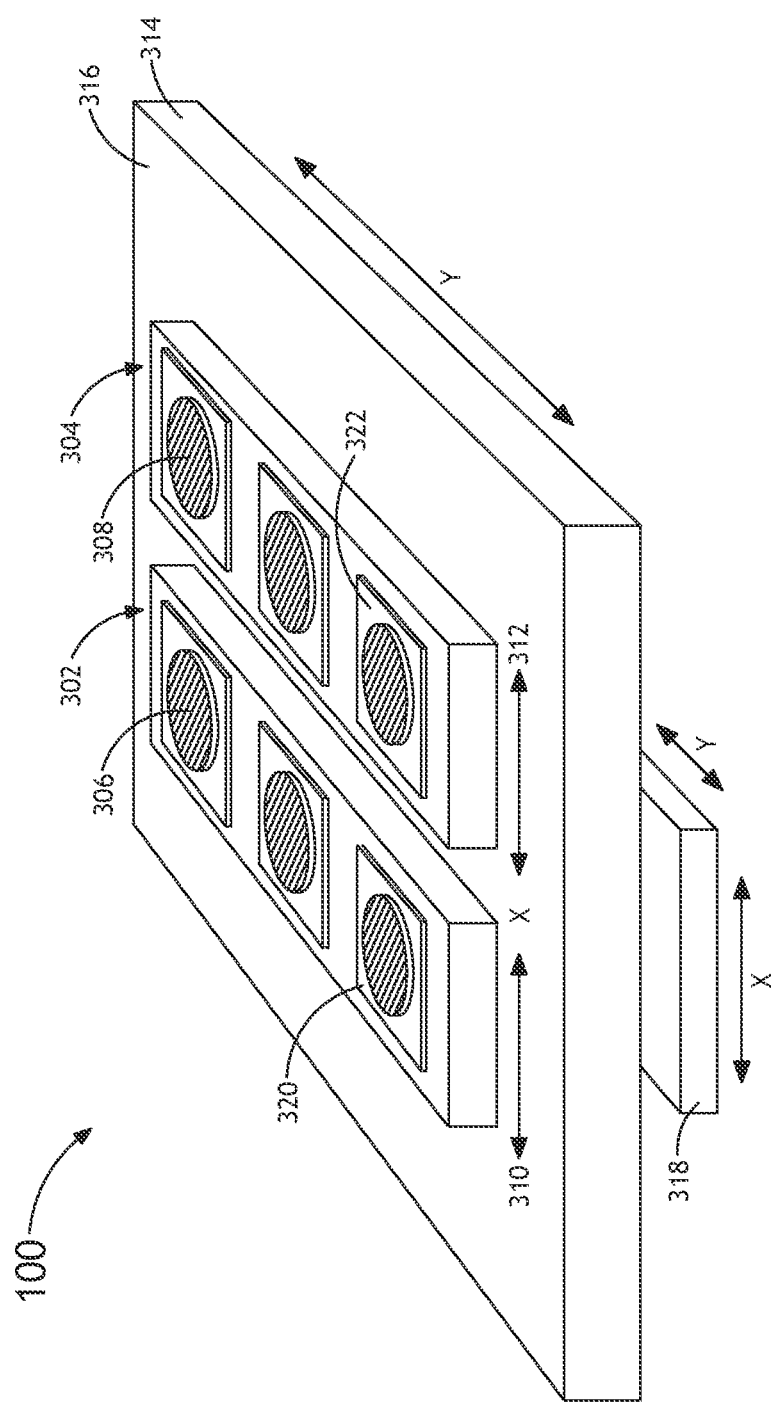
FIG. 3B is a high level schematic view of a linear stacked scanning stage, in accordance with one embodiment of the present invention.

FIGS. 3A and 3B illustrate a high level schematic view of a linear stacked wafer stage, in accordance with an alternative embodiment of the present invention. It is noted herein that the previous description of the stacked wafer stage 100 of FIGS. 2A and 2B should be interpreted to apply all of the various embodiments and implementation of the present disclosure unless otherwise noted. As such, components and embodiments of FIGS. 2A and 2B should be interpreted to extend to FIGS. 3A and 3B.

As previously described, the stacked wafer stage 100 includes a first upper fast stage 302 and a second upper fast stage 304 disposed on the surface 316 of a carrier stage 314. Each of the upper fast stages 302, 304 is configured to secure and translate a set of wafers 306, 308. In this regard, the first upper fast stage 302 is configured to secure and translate a first set of wafers 306, while the second upper stage 304 is configured to secure and translate a second set of wafers 306.

In contrast to the embodiment of FIGS. 2A and 2B, the upper fast stages 302 and 304 are translatable in either opposite directions or the same direction along the X-axis, as indicated by arrows 310 and 312. As such, the upper stages 302 and 304 may move in a manner which does not act to cancel out their inertial reaction forces. In an additional aspect, the carrier stage 314 is configured to translate the first upper fast stage 302 and the first upper fast stage 304 along the Y-axis, as indicated in FIG. 3A.

In a further aspect, in order to compensate for the inertial reaction forces that may be generated due to the motion of the upper fast stages 302, 304 along the X-axis and the motion of the carrier stage 314 along the Y-axis, the stage 100 may include a counter mass 318 suitable for translation along both the X-axis and the Y-axis. In this regard, the counter mass 318 is configured to move along the X-axis and/or Y-axis in a manner (i.e., distance, direction, and speed) to substantially counter inertial reaction forces along the X- and Y-direction generated by the Y-motion of the carrier stage 314 and the X-motion of the upper fast stages 302, 304.

As previously described herein, each of the upper fast stages 302, 304 may include a long-stroke scanning stage. For example, the first upper fast stage 302 may include a first long-stroke scanning stage 303, while the second upper fast stage 304 may include a second long-stroke scanning stage 305. In a further embodiment, as previously described, each of the long-stroke scanning stages 303, 305 may include a maglev stage (e.g., variable reluctance actuators), or an air bearing stage translatable along the X-axis.

As shown in FIG. 3B, each of the fast upper stages 302, 304 may include a set of short-stroke stages 320, 322. For example, the first fast upper stage 302 may include a first plurality of short-stoke stages 320 disposed on the surface of the long-stroke scanning stage 303 of the first upper stage 302. In addition, the second fast upper stage 304 may include a second plurality of short-stroke stages 322 disposed on the surface of the long-stroke scanning stage 305 of the second upper stage 304. Each short-stroke stage of the first plurality of short-stroke stages 320 may be configured to hold and secure a wafer of the first plurality of wafers 306, while each of the second plurality of short-stroke stages 322 may be configured to secure a wafer of the second plurality of wafers 308. As previously noted herein, the short-stroke stages 320, 322 may include maglev stages configured for actuation along at least one of the X-axis, a Y-axis, and a Z-axis. In a further embodiment, the short-stroke stages 320, 322 may include maglev stages controlled utilizing Lorentz type motors.

In another aspect, as previously described herein, the carrier stage 314 may include a maglev stage, an air bearing stage, or a roller bearing stage suitable for translation along the Y-axis.

In another embodiment, the wafers 306, 308 may be secured to the upper fast stages 302 and 304 in any manner known in the art. For instance, the wafers 306, 308 may be mechanically secured to the wafer stages 302, 304 using a set of mechanical chucks (one for each wafer). In another instance, the wafers 306, 308 may be secured to the wafer stages 302, 304 using a set of air chucks (one for each wafer). In yet another instance, the wafers 306, 308 may be secured to the wafer stages 302, 304 using electrostatic chucks (one for each wafer), as will be discussed in greater detail further herein.

Figure 4A:
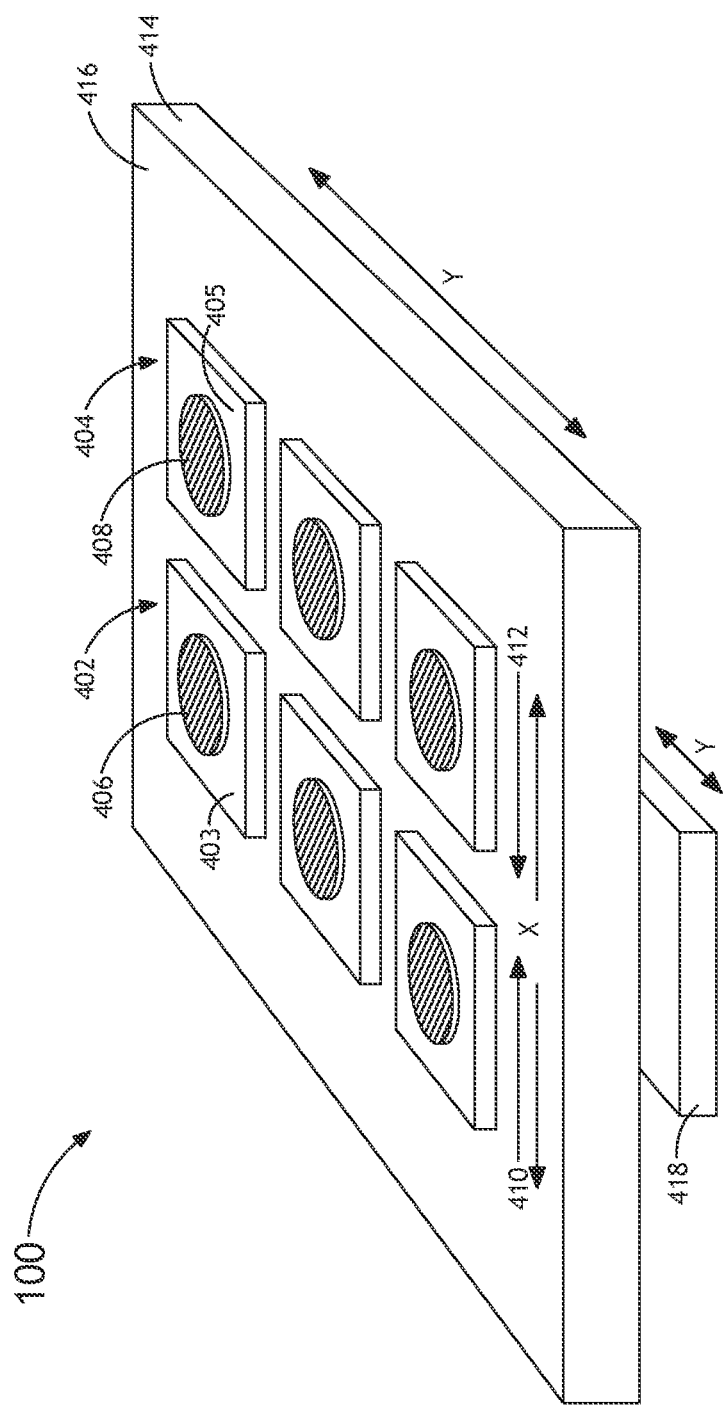
FIG. 4A is a high level schematic view of a linear stacked scanning stage, in accordance with one embodiment of the present invention.
Figure 4B:
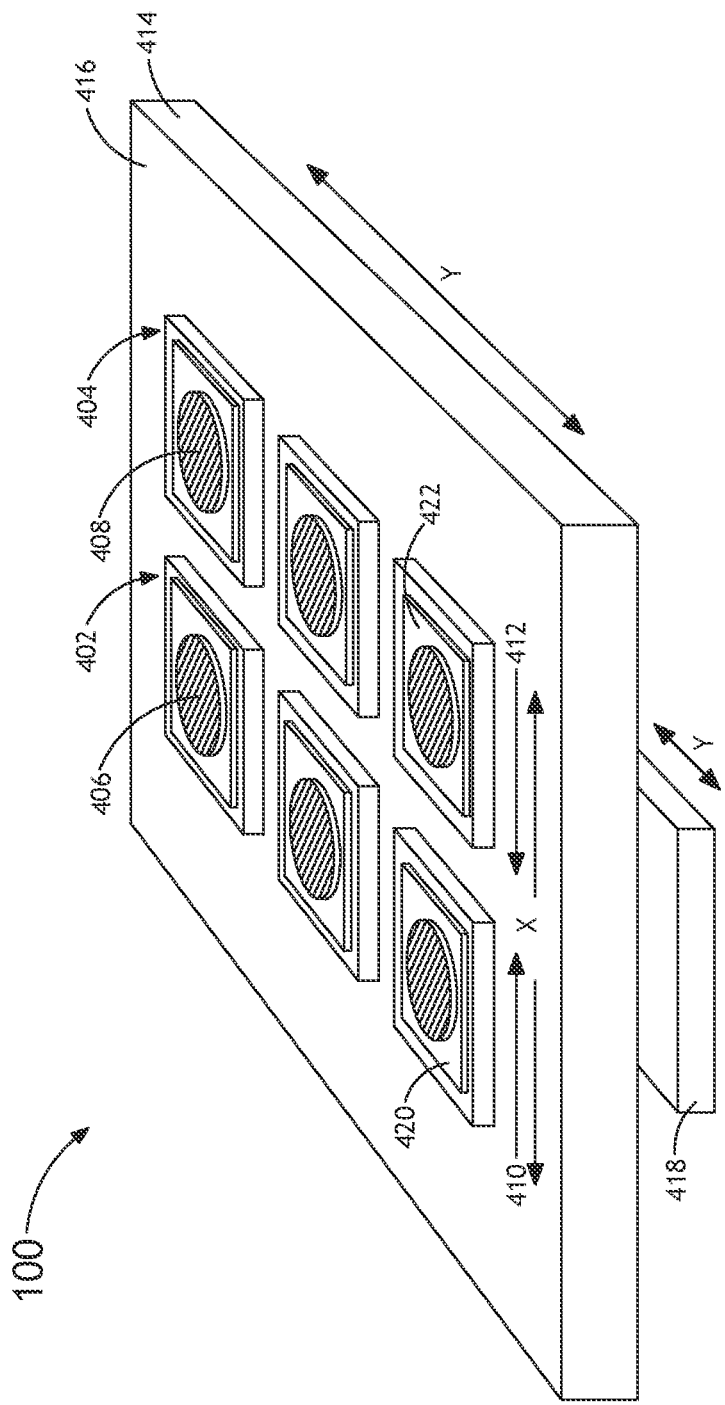
FIG. 4B is a high level schematic view of a linear stacked scanning stage, in accordance with one embodiment of the present invention.

FIGS. 4A and 4B illustrate a high level schematic view of a linear stacked wafer stage, in accordance with an alternative embodiment of the present invention. It is noted herein that the previous description of the stacked wafer stage 100 of FIGS. 2A and 2B stacked wafer stage 100 of FIGS. 3A and 3B should be interpreted to apply to all of the various embodiments and implementation of the present disclosure unless otherwise noted. As such, components and embodiments of FIGS. 2A, 2B, 3A, and 3B should be interpreted to extend to FIGS. 4A and 4B.

As shown in FIGS. 4A and 4B, the stacked wafer stage 100 includes a first plurality of upper fast stages 402 and second plurality of upper fast stages 404. In this regard, each upper fast stage of the first plurality 402 corresponds to an upper fast stage in the second plurality 404. Each of the upper fast stages of the first set of stages 402 is configured to secure and translate a wafer 406, while each of the upper fast stages of the second set of stages 404 is configured to secure and translate a wafer 406.

The upper fast stages of set 402 and 404 are translatable opposite directions along the X-axis, as indicated by arrows 410 and 412. In this sense, the motion of the first upper stage of set 402 and the second upper stages of set 404 are coordinated such that the inertial reaction forces generated by the motion of the first upper fast stages and the second upper fast stage are substantially canceled out.

In a further aspect, in order to compensate for the inertial reaction forces that may be generated due to the motion of the carrier stage 414 along the Y-axis, the stage 100 may include a counter mass 418 suitable for translation along the Y-axis. In this regard, the counter mass 418 is configured to move along the Y-axis in a manner (i.e., distance and speed) to substantially counter inertial reaction forces along the Y-direction generated by the Y-motion of the carrier stage 414.

As previously described herein, each of the upper fast stages 402, 404 may include a long-stroke scanning stage. For example, each of the first upper fast stages 402 may include a first long-stroke scanning stage 403, while the second upper fast stages 404 may include a second long-stroke scanning stage 405. In a further embodiment, as previously described, each of the long-stroke scanning stages 403, 405 may include a maglev stage (e.g., variable reluctance actuators), or an air bearing stage translatable along the X-axis.

As shown in FIG. 4B, each of the fast upper stages 402, 404 may include a short-stroke stage 420, 422. As previously noted herein, the short-stroke stages 420, 422 may include maglev stages configured for actuation along at least one of the X-axis, a Y-axis, and a Z-axis. In a further embodiment, the short-stroke stages 420, 422 may include maglev stages controlled utilizing Lorentz type motors.

In another aspect, as previously described herein, the carrier stage 414 may include a maglev stage, an air bearing stage, or a roller bearing stage suitable for translation along the Y-axis.

Figure 5A:
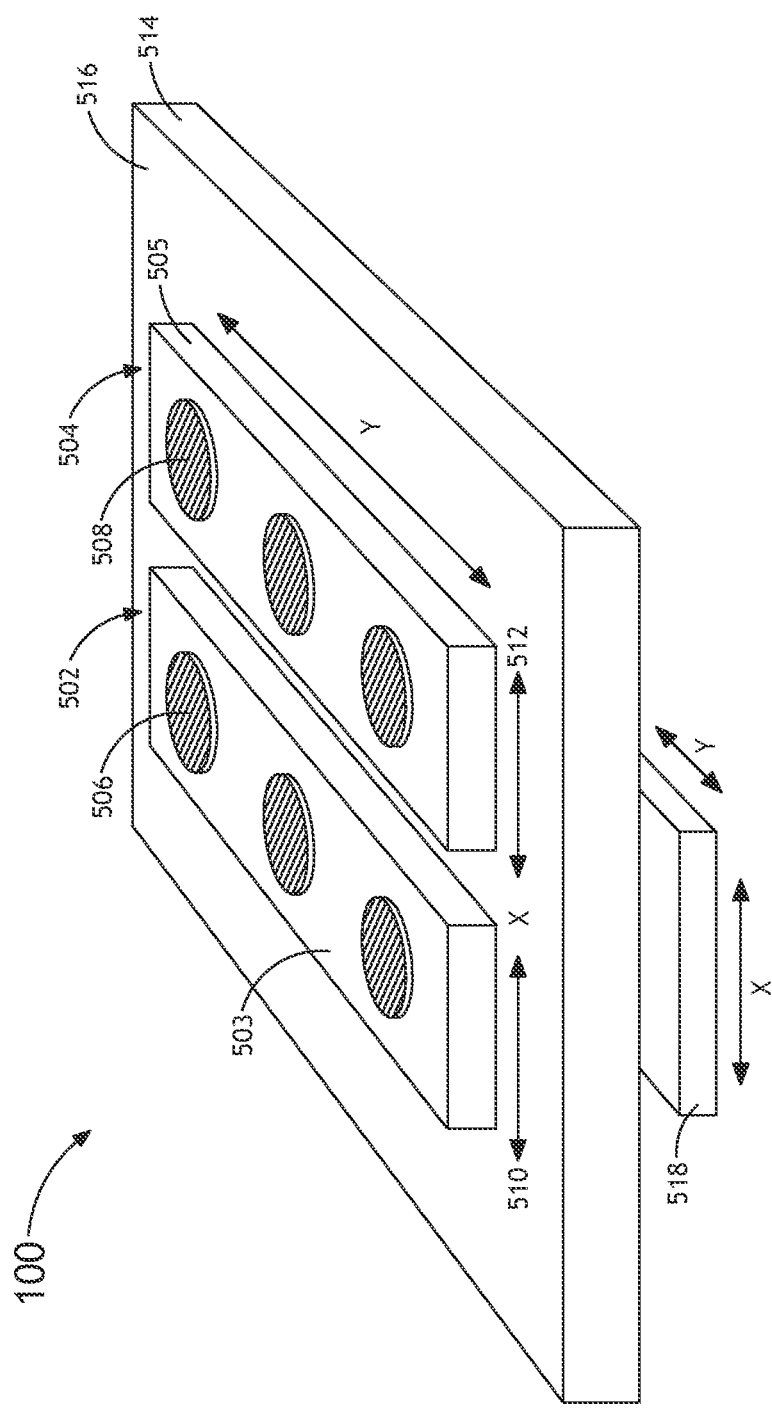
FIG. 5A is a high level schematic view of a linear stacked scanning stage, in accordance with one embodiment of the present invention.
Figure 5B:
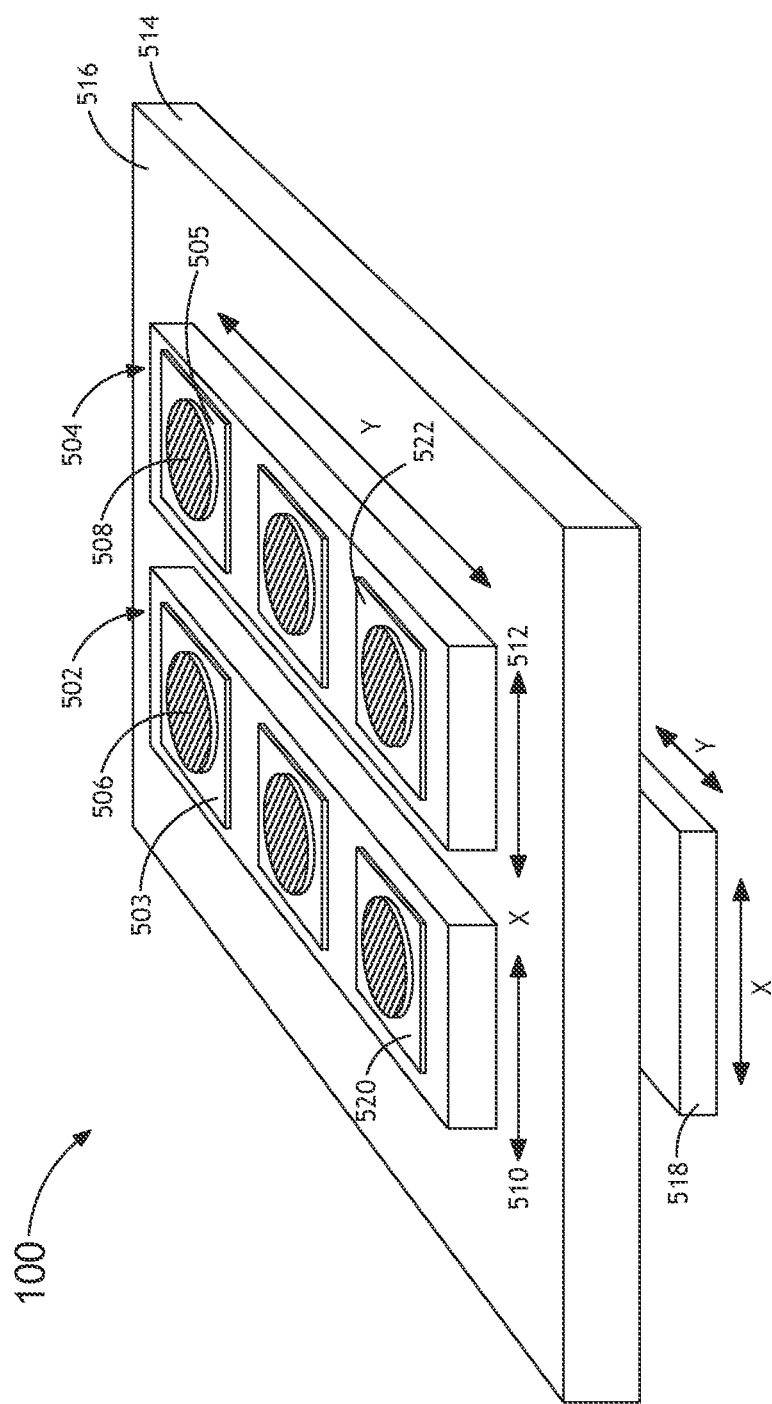
FIG. 5B is a high level schematic view of a linear stacked scanning stage, in accordance with one embodiment of the present invention.

FIGS. 5A and 5B illustrate a high level schematic view of a linear stacked wafer stage, in accordance with an alternative embodiment of the present invention. It is noted herein that the previous description of the stacked wafer stage 100 of FIGS. 2A-4B should be interpreted to apply to all of the various embodiments and implementations of the present disclosure unless otherwise noted. As such, components and embodiments of FIGS. 2A-4B should be interpreted to extend to FIGS. 5A and 5B.

As previously described, the stacked wafer stage 100 includes a first upper fast stage 502 and a second upper fast stage 504 disposed on the surface 516 of a carrier stage 514. Each of the upper fast stages 502, 504 is configured to secure and translate a set of wafers 506, 508. In this regard, the first upper fast stage 502 is configured to secure and translate a first set of wafers 506, while the second upper stage 504 is configured to secure and translate a second set of wafers 506.

The upper fast stages 502 and 504 are translatable in either opposite directions or the same direction along the X-axis, as indicated by arrows 510 and 512. As such, the upper stages 502 and 504 may move in a manner which does not act to cancel out their inertial reaction forces. Further, the upper fast stages 502 and 504 are further translatable in a direction along the Y-axis. In an additional aspect, the carrier stage 514 is fixed and configured to hold the first upper fast stage 502 and the second upper fast stage 504.

In a further aspect, in order to compensate for the inertial reaction forces that may be generated due to the motion of the upper fast stages 502, 504 along the X-axis and the Y-axis, the stage 100 may include a counter mass 518 suitable for translation along both the X-axis and the Y-axis. In this regard, the counter mass 518 is configured to move along the X-axis and/or Y-axis in a manner (i.e., distance, direction, and speed) to substantially counter inertial reaction forces along the X- and Y-direction generated by the X- and Y-motion of the upper fast stages 502, 504.

As previously described herein, each of the upper fast stages 502, 504 may include a long-stroke scanning stage. For example, the first upper fast stage 502 may include a first long-stroke scanning stage 503, while the second upper fast stages 504 may include a second long-stroke scanning stage 505. In a further embodiment, as previously described, each of the long-stroke scanning stages 503, 505 may include a maglev stage (e.g., variable reluctance actuators), or an air bearing stage translatable along the X- and/or Y-axis.

As shown in FIG. 5B, the fast upper stages 502, 504 may include a short-stroke stage 520, 522. As previously noted herein, the short-stroke stages 520, 522 may include maglev stages configured for actuation along at least one of the X-axis, a Y-axis, and a Z-axis. In a further embodiment, the short-stroke stages 520, 522 may include maglev stages controlled utilizing Lorentz type motors.

Figure 6A:
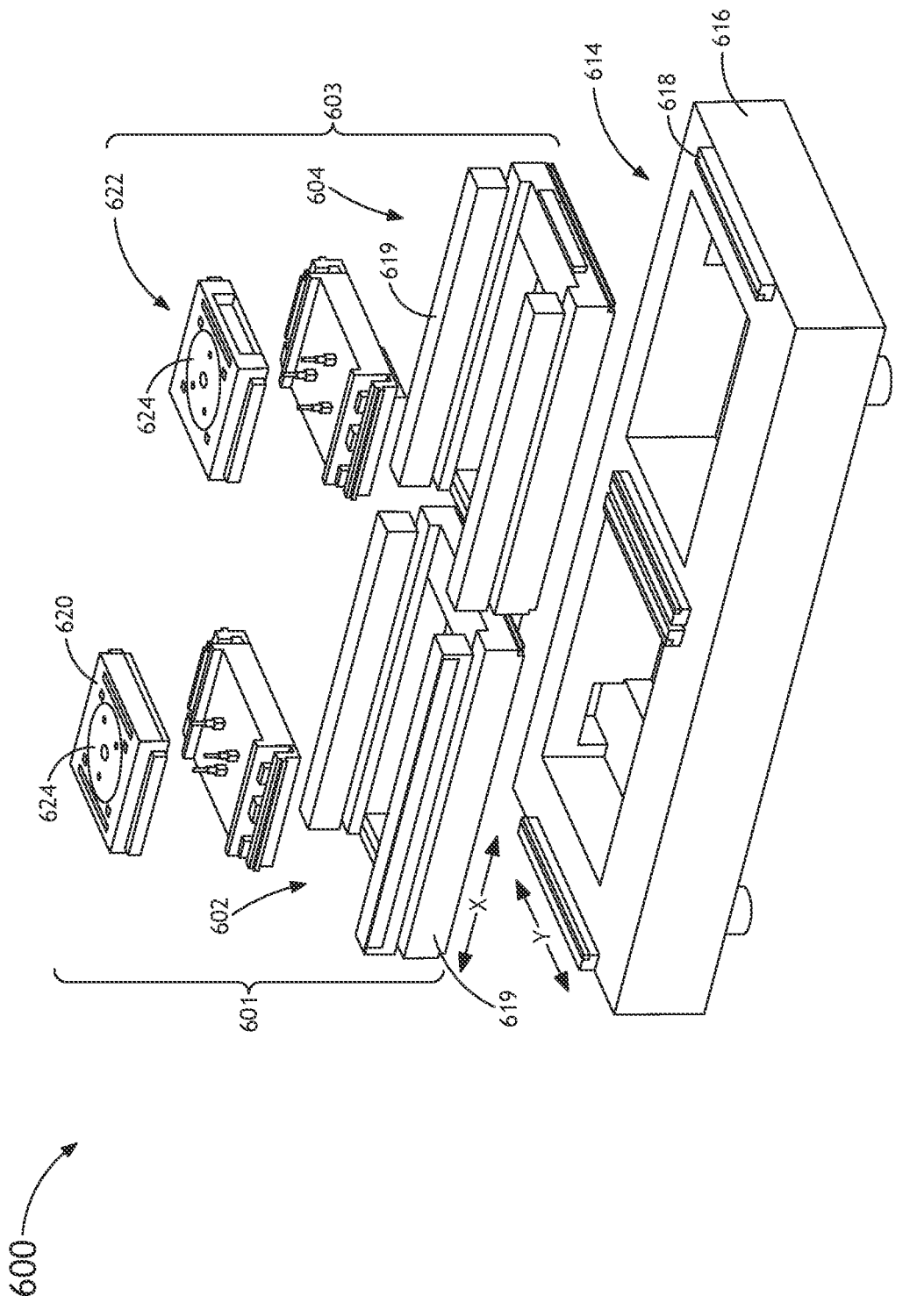
FIG. 6A is a schematic view of linear stacked scanning stage, in accordance with a preferred embodiment of the present invention.
Figure 6B:
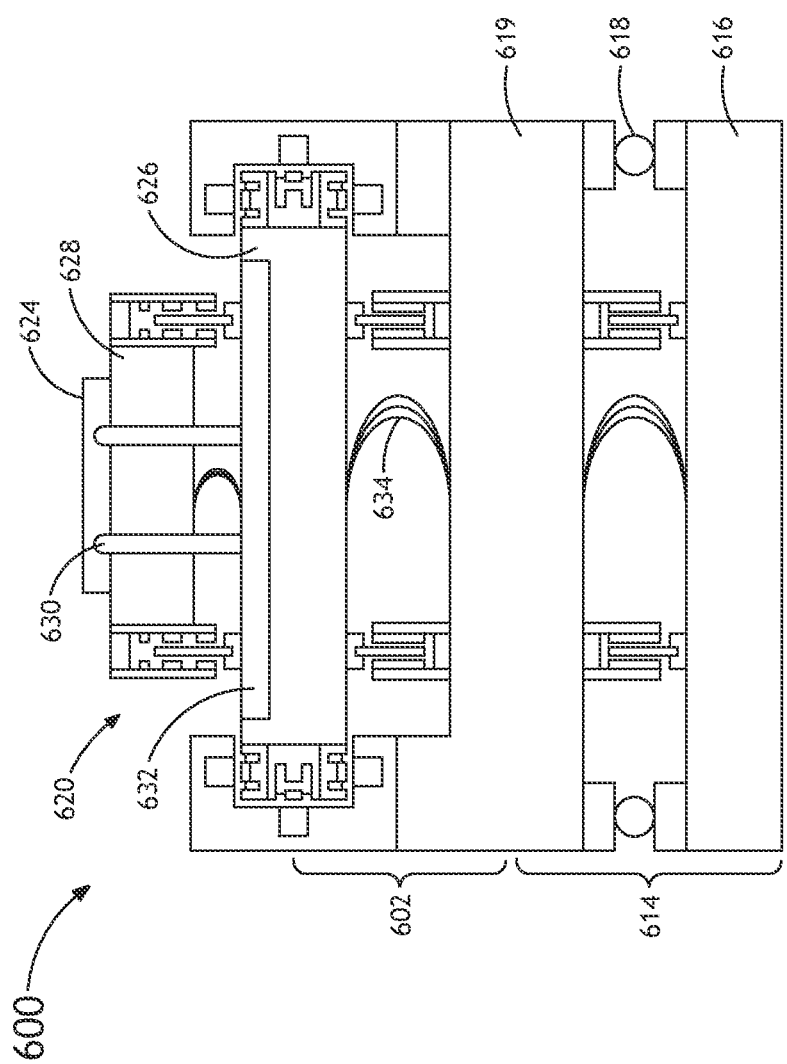
FIG. 6B is a cut away schematic view of linear stacked scanning stage, in accordance with a preferred embodiment of the present invention.
Figure 6C:
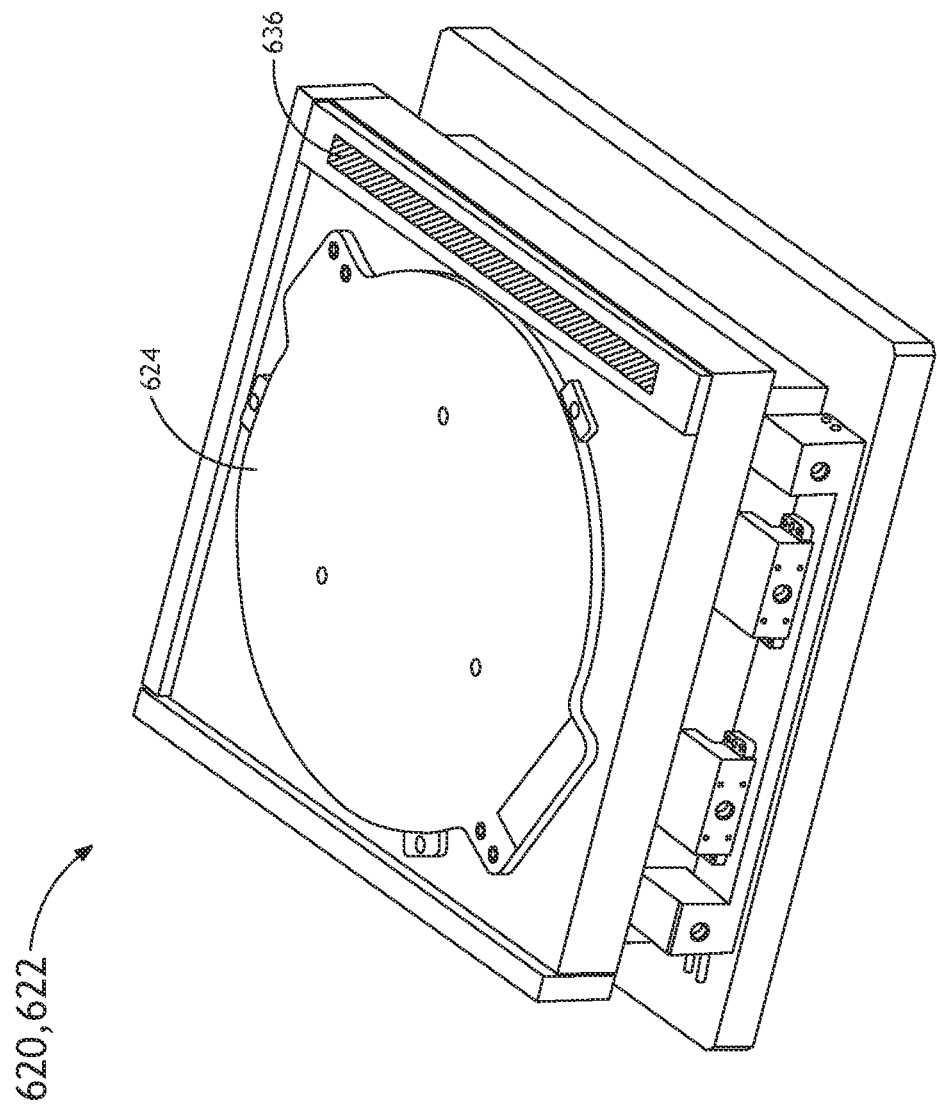
FIG. 6C is a schematic view of a short-stroke scanning stage of a linear stacked scanning stage, in accordance with a preferred embodiment of the present invention.

FIGS. 6A-6C illustrate schematic views of a stacked scanning stage system 600 in accordance with a preferred embodiment of the present invention. It is noted herein that the embodiments and components discussed previously herein should be interpreted to extend to the system 600 unless otherwise noted. Moreover, the embodiments and components discussed further herein should be interpreted to extend to the various embodiments and components described previously herein.

The preferred stacked stage architecture 600 may include a base assembly 616, a carrier stage 614 configured for translation in the Y-direction, a first upper stage 601 and a second upper stage 603. In one aspect, the first upper stage 601 may include a first long-stroke stage 602 and a short-stroke stage 620, while the second upper stage 603 may include a second long-stroke stage 604 and a short-stroke stage 622. As discussed previously herein, motion of the first upper stage 601 and the second upper stage 603 may coordinated such that the inertial reaction forces from each is canceled. Further, the first upper stage 601 and the second upper stage 603 are both operably connected to a conventional roller bearing carrier stage 614 configured to translate the entire assembly along the Y-axis, as discussed previously throughout the present invention. In turn, the carrier stage 614 may be operably coupled to the surface of a base assembly 616.

In one embodiment, the first upper stage 601 and the second upper stage 603 may be housed in a common vacuum system (e.g., housed in the same vacuum vessel). In addition, the first upper stage 601 and the second upper stage 603 may share various platform components.

In a further embodiment, each of the long-stroke scanning stages 602 604 may include a magnetic levitation, or "maglev," stage. For example, the long-stroke stages 602, 604 of the upper fast stages 601, 603 may each include a single axis maglev stage. For instance, each long-stroke stage 602, 604 may include a single axis maglev stage suitable for translation along the X-axis. In a further embodiment, the long-stroke stages 602, 604 may include a set of variable reluctance actuators. In this regard, linear scanning in the system 600 may be achieved using a pair of three-phase linear actuators. In another embodiment, each of long-stroke stages 602, 604 of the upper fast stages 601, 603 may include an air bearing stage. For instance, each long-stroke stage 602, 604 may include a single axis air bearing stage suitable for translation along the X-axis.

In another embodiment, as shown in FIG. 6C, the short-stroke stages 620, 622 may include maglev stages configured for actuation along at least one of the X-axis, a Y-axis, and a Z-axis, thereby providing six degrees of translational freedom to each wafer disposed on the given short-stroke stage. In a further embodiment, the short-stroke stages 620, 622 may include maglev stages controlled utilizing Lorentz type motors. In a further aspect, each short-stroke stage 620, 622 may be actuated with Lorentz motors that are actively cooled.

In another embodiment, the carrier stage 614 may include a set of roller bearings 618 configured to translate the carriage 619 of the given long-stroke stage (602 or 604) relative to the base assembly 616 along the Y-direction As shown in FIG. 6B, a short-stroke stage 620 of a given upper fast stage (e.g., stage 601 or stage 603) may be coupled to an underlying long-stroke stage 602 via an interface plate 632 and the carrier 626 of the long-stroke stage 602. In addition, the stacked stage 600 may include a service loop 634 that provides the various cabling for the various components (e.g., motors, sensors, coolant supply, gas supply, and the like) throughout the various levels (e.g., carrier stage 614, long-stroke stage 602, and short-stroke stage 620) of the stage 600.

In another embodiment, each short-stroke stage 620, 622 may be fabricated from a material having high thermal stability characteristics. For example, the short-stroke stages 620, 622 may be formed from a material having minimal thermal expansion properties. Various glass-ceramic materials have sufficiently small thermal expansion coefficients for implementation in the present invention. For example, the material ZERODUR is a glass-ceramic material displaying highly stable thermal expansion characteristics. In a further embodiment, the material of the short-stroke stages 620, 622 may include pass through holes suitable for circulating a selected coolant, thereby increasing the thermal control (and thermal expansion/contraction) of the short-stroke stages 620, 622.

In another embodiment, the long-stroke stages 602, 604 and short-stroke stage 620, 622 of the system 600 may include magnetic shielding and may be positioned such that their influence on the e-beam of the implementing lithography system is maintained within an acceptable tolerance level. For example, the long-stroke stages 602, 604 and the short-stroke stages 620, 622 may include magnetic shielding suitable for shielding spatially fixed magnetic disturbances (e.g., at a threshold level of approximately 100 milli-Gaus at the position of the e-beam. By way of another example, the long-stroke stages 602, 604 and the short-stroke stages 620, 622 may include magnetic shielding suitable for shielding stochastic magnetic disturbances (e.g., at a threshold level of 1 milli-Gauss at the e-beam).

In another embodiment, as shown in FIG. 6C, an electrostatic chuck 624 may be operably connected to each short-stroke stage 620, 622 of each upper stage 601, 603. For example, the electrostatic chuck 624 may include a double-sided electrostatic chuck. In this regard, a double-sided electrostatic chuck may be used to attach the chuck to a given short-stroke stage. The electrostatic chuck may also be used to attach a given wafer to the surface of the chuck, thereby securing the wafer to the given short-stroke stage of the given upper stage of the stacked scanning stage 600. In a further embodiment, the electrostatic chuck 624 may include cooling and gas injection sub-systems suitable for providing thermal management and adequate thermal contact to the wafer. In further embodiment, each short-stroke stage 620,622 may include a set of lift pins suitable for loading and unloading a wafer on the electrostatic chuck.

Figure 6D:
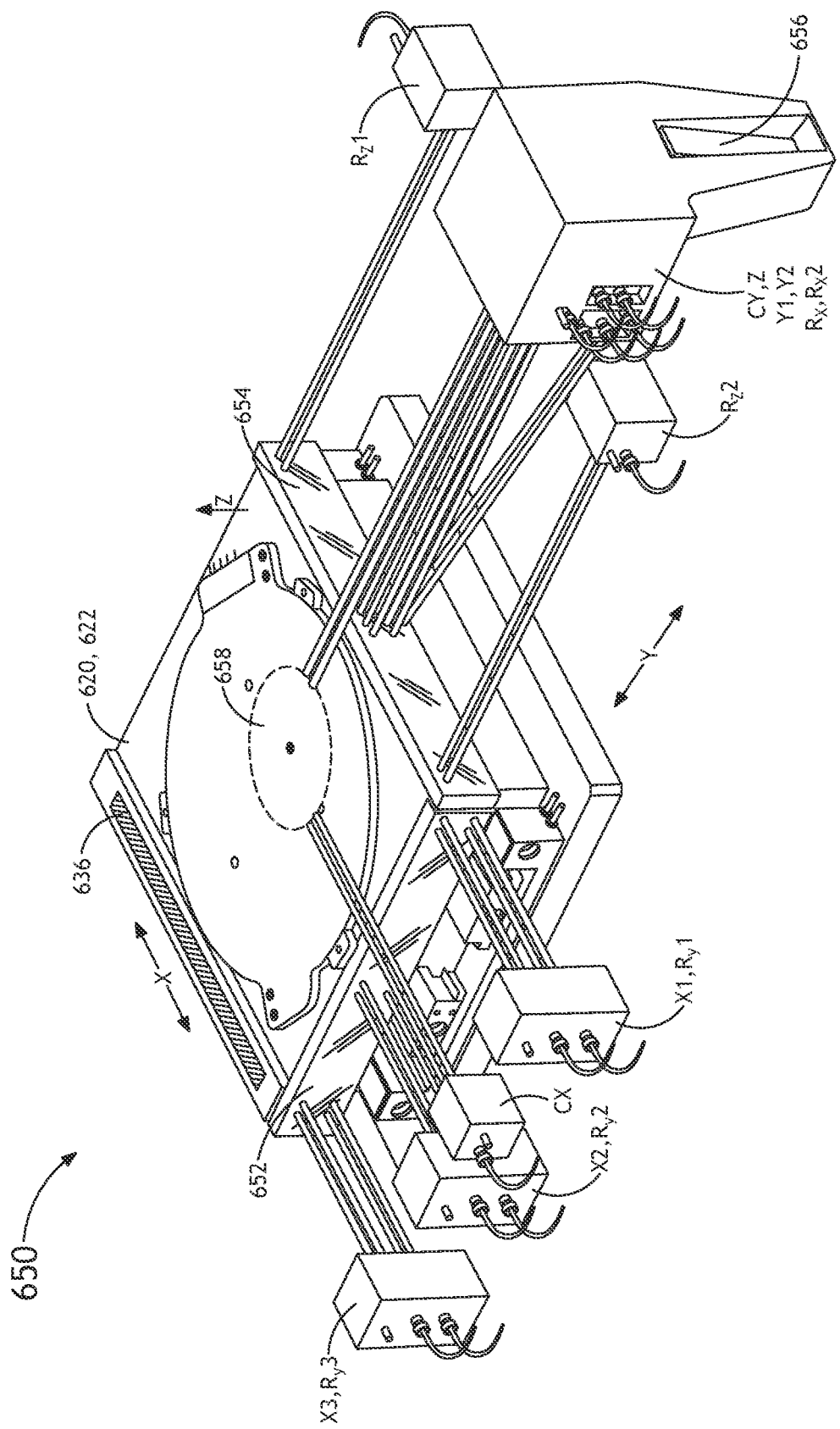
FIG. 6D is a schematic view of an interferometer based stage metrology system used to measure the position and rotation of a short-stroke scanning stage of the linear stacked scanning stage, in accordance with a preferred embodiment of the present invention.
Figure 6E:
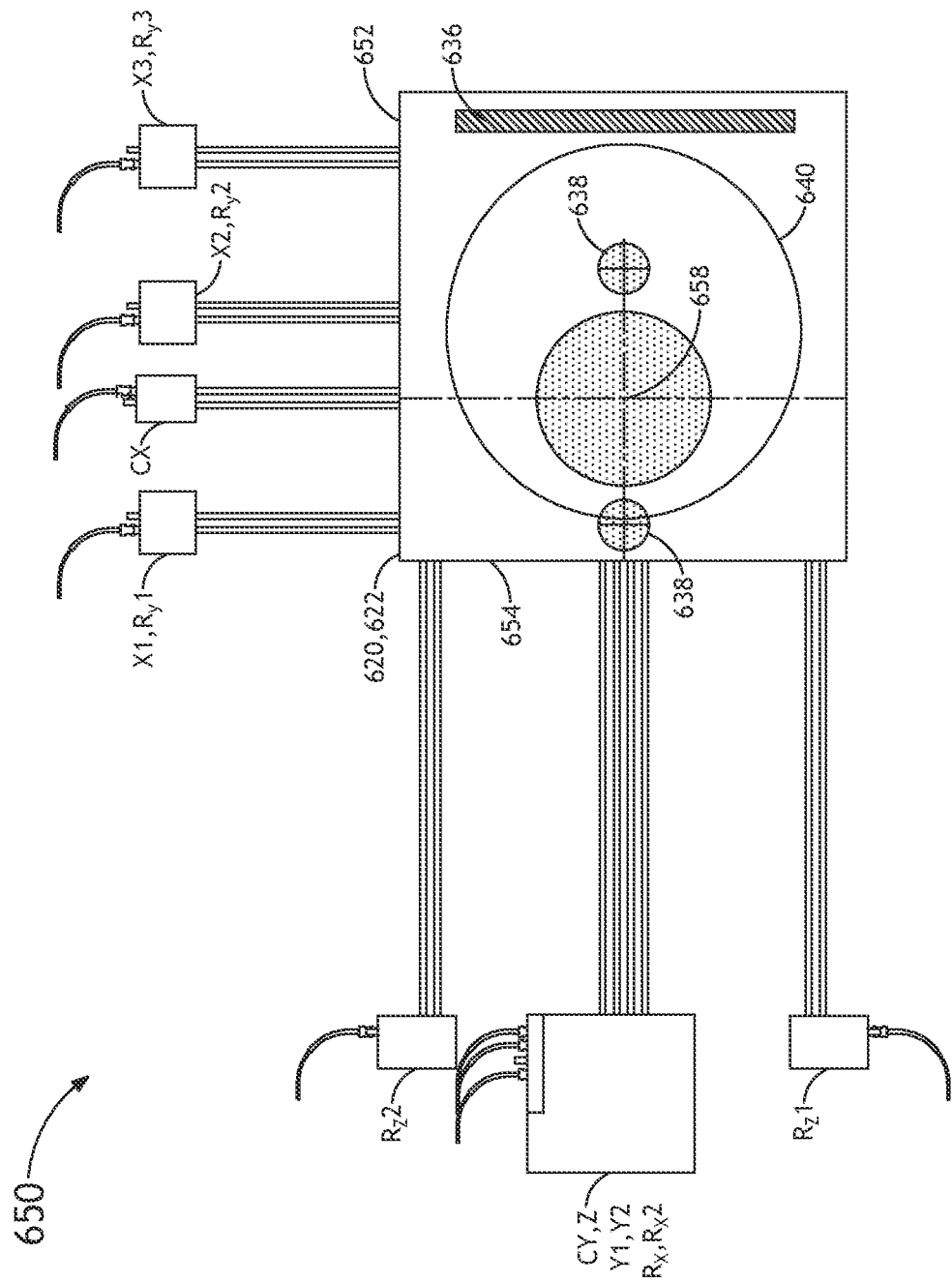
FIG. 6E is a top schematic view of an interferometer based stage metrology system used to measure the position and rotation of a short-stroke scanning stage of the linear stacked scanning stage, in accordance with a preferred embodiment of the present invention.
Figure 6F:
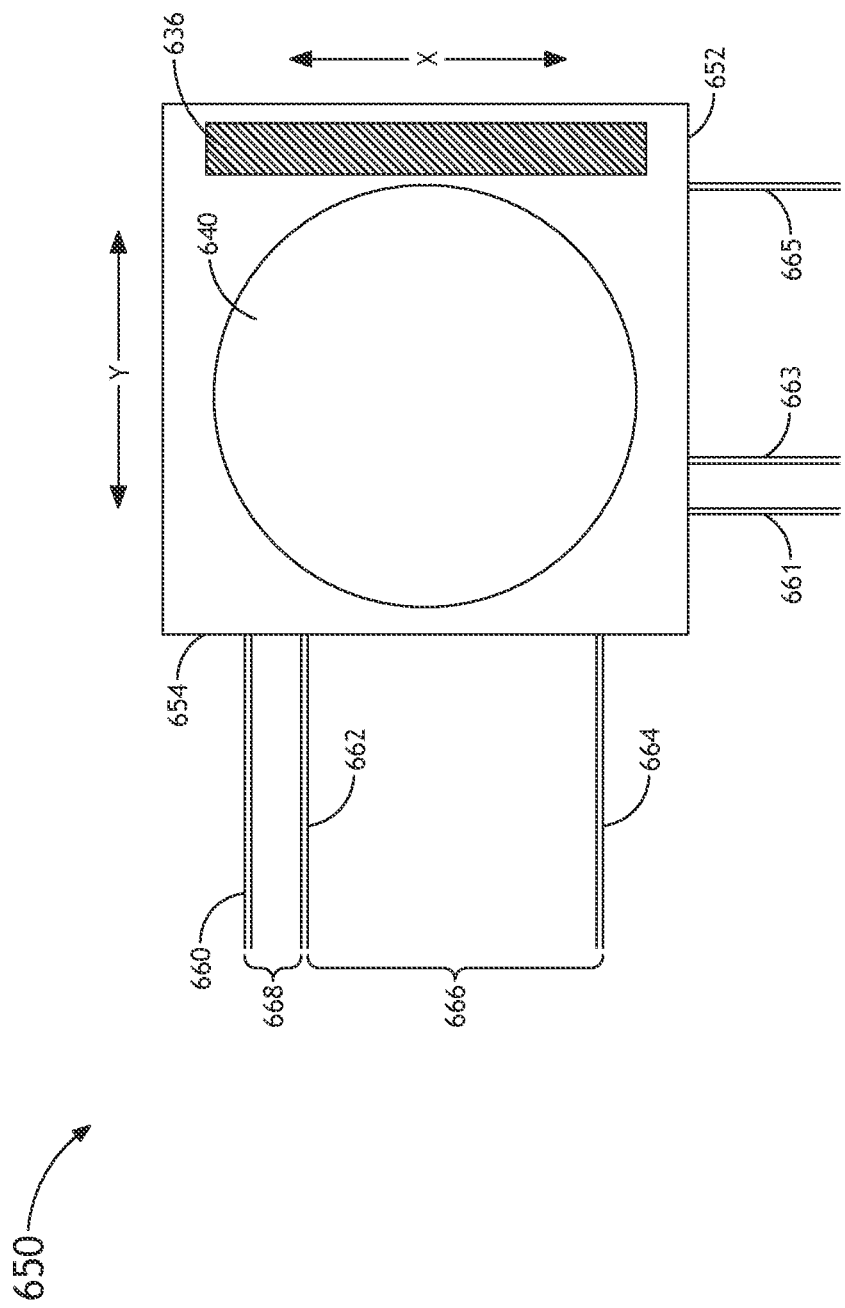
FIG. 6F is a top schematic view of an interferometer based stage metrology system showing the interferometer beam spacing in a shape error recovery application, in accordance with a preferred embodiment of the present invention.

FIGS. 6D-6F illustrate an interferometry-based stage metrology system 650, in accordance with one embodiment of the present invention. In one embodiment, as shown in FIGS. 6D-6E, the interferometer stage metrology system 650 may be used to measure the position and/or rotation of a short-stroke scanning stage of an upper fast stage of stacked staged system. For example, one or more short-stroke stages 620, 622 of the stacked stage architecture 600 described previously throughout the present disclosure may be equipped with an interferometry-based stage metrology system 650. Applicant notes that while of the present disclosure focuses on the implementation of the metrology system 650 in the context of the stage architecture 600 described herein, this architecture is not a limitation to the metrology system 650 of the present invention. Rather, the interferometry-based stage metrology system 650 described herein may be extended to any short-stroke wafer stage configuration.

In one embodiment, the stage metrology system 650 is configured to interferometrically measure the spatial aspects of the short-stroke stages (e.g., 620 or 622) of the stacked stage system 600 in all six degrees of freedom (i.e., x, y, and z positions and rotations about x, y, and z-axes). In another embodiment, the metrology system 650 for a given short-stroke stage may include at least three interferometers, one or more interferometers for each direction (e.g., x, y, and z directions).

In one embodiment, each short-stroke stage 620, 622 includes a first interferometer mirror disposed on a first surface of the short-stroke stage 620, 622 and a second interferometer mirror disposed on a second surface of the short-stroke stage 620, 622. For example, each short-stroke stage 620, 622 may include a mirror block 628, having a first mirror 652 (i.e., the X mirror) suitable for measuring the X-position of the given short-stroke stage 620 or 622. Further, each short-stroke stage 620, 622 may include a second mirror 654 (i.e., Y/Z mirror) suitable for measuring the Y- and Z-positions of the given short-stroke stage 620, 622. In some embodiments, the stage metrology system 650 includes various optical reference elements mounted on a temperature controlled and vibration isolated metrology frame (not shown). In one embodiment, a portion of the optical reference elements may be used to measure the X-position of the stage 620 (or 622) utilizing the X-mirror 652. In addition, the stage metrology system 650 may include optical reference elements used to measure the Y-position of the stage 620 (or 622) utilizing the Y/Z mirror 654. The Z-position of the stage 620 (or 622) may be measured utilizing a tilted mirror 656. In one embodiment, the position of an e-beam column, depicted by the dotted circle 658 may be determined utilizing interferometer elements CX and CY, allowing the metrology system 650 to track the position of the e-beam column 658.

In one embodiment, the interferometer stage metrology system 650 is configured to measure shape error associated with one or more of the interferometer mirrors (e.g., X mirror or Y/Z mirrors) of the metrology system 650. In one embodiment, the metrology system 650 may include redundant interferometer beams for each axis of measurement, allowing for the recovery of shape error associated with the interferometer mirrors, such as X mirror 652 and Y/Z mirror 654.

In one embodiment, the metrology system 650 may include three interferometers for a given axis of measurement, such as the Y-axis shown in FIG. 6F, for a given short-stroke stage 620, 622. It is noted herein that the three interferometers 660, 662, 664 associated with an axis (Y-axis) of measurement form two pairs of interferometers 666 and 668. In one embodiment, the first pair 666 is widely spaced in order to measure "yaw," while the second pair 668 is closely spaced in order to measure shape. Likewise, interferometers 661, 663, and 665 are associated with an additional axis (X-axis) of measurement, as shown in FIG. 6F.

Figure 6G:
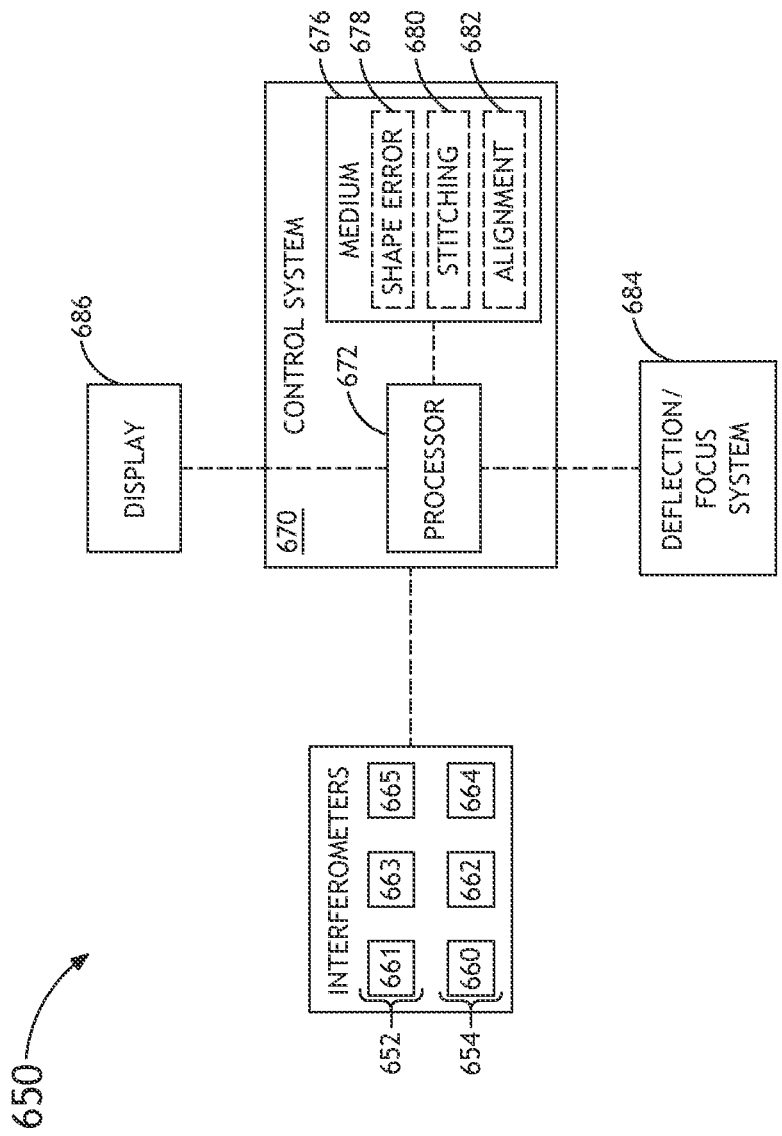
FIG. 6G is a block diagram view of an interferometer based stage metrology system equipped with a control system, in accordance with a preferred embodiment of the present invention.

In another embodiment, as shown in FIG. 6G, the interferometer metrology system 650 includes a control system 670 configured to determine shape error for one or more interferometer mirrors (e.g., X mirror 652 or Y/Z mirror 654) of the metrology system 650. In one embodiment, the control system 670 is configured to receive interferometer measurements from the two or more interferometers (e.g., 2 mirrors, 3 mirrors and so on) associated with the first interferometer mirror (e.g., X mirror 652), and interferometer measurements from the two or more interferometers (e.g., 2 mirrors, 3 mirrors and so on) associated with the second interferometer mirror (e.g., Y/Z mirror 654). In another embodiment, the control system 670 is further configured to determine a shape error for the first interferometer mirror using the received interferometer measurements from the two or more interferometers associated with the first interferometer mirror. In another embodiment, the control system 670 is configured to determine a shape error for the second interferometer mirror using interferometer measurements from the two or more interferometers associated with the second interferometer mirror.

In one embodiment, the control system 670 may include one or more processors 672. The control system 670 may further include a non-transitory storage medium 674 (i.e., memory medium) containing program instructions configured to cause the one or more processors 674 to carry out the various steps described through the present disclosure. In the case of shape error recovery, the one or more processors 674 may execute a shape error recovery algorithm 678.

In general, the term "processor" may be broadly defined to encompass any device having one or more processors, which execute instructions from a memory medium. In this sense, the one or more processors 672 may include any microprocessor-type device configured to execute software algorithms and/or instructions. In one embodiment, the one or more processors 672 may consist of a desktop computer or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. The memory medium 676 may store the program instructions suitable for execution by the communicatively coupled one or more processors 672. Program instructions implementing methods such as those described herein may be transmitted over or stored on a carrier medium. The carrier medium may be a transmission medium such as a wire, cable, or wireless transmission link. The memory medium may include any memory medium known in the art such as, but not limited to, a read-only memory, a random access memory, a magnetic or optical disk, solid state memory, or a magnetic tape.

Those skilled in the art should recognize that spatial frequencies may be distributed as if they are white noise, giving a characteristic $1/f^2$ slope in power spectral density (PSD). In addition, a typical beam width (e.g., 6 mm) may provide an additional high frequency roll off due to sampling. In this regard, the surface the interferometer mirrors 652, 654 may be me modeled as filtered white noise, with the filters corresponding to the two effects described above.

In one embodiment, the difference of the distance between interferometer measurement points is acquired. It is recognized herein that as a given scanning process moves the wafer stage, a trailing interferometer beam will at some later time traverse a point previously traversed by the leading interferometer beam. Utilizing information based on this spacing the mirror curve shape can be determined, or estimated.

In another embodiment, neighboring difference measurements will be acquired for a series of positions across the interferometer mirror, and the shape of the given mirror can be recovered for the same spacing. In this regard, by minimizing the difference between the neighboring points for each of a set of separate curves it is possible to reproduce an estimate of the curve of the mirror at all of the measured points.

In one embodiment, time measurements of the interferometry data from the interferometers associated with one of the interferometer mirrors of the metrology system 650 is interpolated to a grid spaced at integer submultiples of the interferometer beam spacing and smaller than the width of the individual interferometer beams. Representing the grid value in vector form provides the unknown value, x. In another aspect, the difference of the measurement between two interferometer beams, d, represents a constraint that can be written as a linear system given by:

$$Ax=d$$

Further, the difference between neighboring points can also be written as a linear system by:

$$Ax=Dx$$

As such, the optimization relationship may be written as:

$$\min_x x^T D^T D x$$

This may be solved by computing the stationary points of the Lagrangian, whereby:

$$L(x,\lambda) = x^T D^T D x - \lambda^T (Ax - d)$$

The above relationship then corresponds to the following solution of the augmented linear system:

$$\begin{bmatrix} D^T D & A^T \\ A & 0 \end{bmatrix} \begin{bmatrix} x \\ \lambda \end{bmatrix} = \begin{bmatrix} 0 \\ d \end{bmatrix}$$

Applicants found that in one embodiment the ideal interferometer beam separation for a one pass calibration is near the lower limits of the possible separation of the beams, approximately 25 nm. In this instance, this provides an error of approximately 1.5 nm, 3σ. Applicants further note that the error curves (not shown) may achieve a minimum at the point when the error due to measurement uncertainty resulting from a short interferometer beam spacing balances with the lack of resolution due to a long interferometer beam spacing. In addition, the calibration error may be reduced by using multiple passes to calibrate the system. In this regard, since the measurement errors are statistically independent, for N passes, a sqrt(N) reduction in effective measurement noise is expected. The calibration error may also be reduced by using the difference of the measurements from the $3^{rd}$ interferometer as an additional constraint. This is particularly effective if this distance is a half-integer multiple of the first (narrow) pair. It is noted herein that adding a third interferometer provides the ability to position the beams further apart, while maintaining similar levels of accuracy.

In another embodiment, in order to accommodate the stroke of the stage 620, multiple interferometer measurements are "stitched," or combined, in order to provide a single measurement. It should be recognized by those skilled in the art that during a wafer scan process a position offset error may occur upon transferring between an interferometry measurement carrier out with a first interferometer and the interferometry measurement carried out with a second interferometer. It is further recognized that, since position data extracted from the first and second interferometer may be fed into a wafer stage position controller, an observed position offset error may cause the controller to incorrectly translate or "jerk" the system abruptly.

In one embodiment, the control system 670 is further configured to carry out a stitching algorithm 680 for stitching, or combining, measurements from two or more interferometers associated with a given mirror of a short-stroke scanning stage 620, 622. For example, the control system 670 may stitch together measurements from a first interferometer (e.g., 661) and a second interferometer (e.g., 663), each associated with the first interferometer mirror (e.g., X mirror 652) of the metrology system 650. Further, the control system 670 may stitch together measurements from a first interferometer (e.g., 660) and a second interferometer (e.g., 662), each associated with the second interferometer mirror (e.g., Y/Z mirror 654) of the metrology system 650.

In another embodiment, the stitching algorithm 680 carried out by the control system 670 may provide for a "bumpless" transfer between a first interferometer measurement and a second interferometer measurement associated with a given interferometer mirror. It is recognized herein that the use of a bumpless transfer process during the transfer between a first interferometer measurement and a second interferometer measurement associated with a given interferometer mirror may eliminate or at least reduce the position offset error between the position data of the two interferometers. In this regard, the stitching process may act to create a non-abrupt hand-off between a first interferometer and a second interferometer. For example, the control system 670 may stitch together measurements from a first interferometer (e.g., 661) and a second interferometer (e.g., 663) associated with the first interferometer mirror (e.g., X mirror 652) of the metrology system 650 using a bumpless transfer procedure. Further, the control system 670 may stitch together measurements from a first interferometer (e.g., 660) and a second interferometer (e.g., 662) each associated with the second interferometer mirror (e.g., Y/Z mirror 654) of the metrology system 650 using a bumpless transfer procedure. This may be accomplished by syncing controllers of the first and second interferometers such that a positional offset error is compensated for in an interferometer receiving the measurement hand-off from the previous interferometer. Those skilled in the art will recognize that any bumpless transfer procedure known in the art may be implemented in the context of the present invention.

Referring again to FIGS. 6C-6E, each short-stroke stage 620, 622 may include an alignment sensor 636, in accordance with one embodiment of the present invention. In one embodiment, the alignment sensor 636 is configured to provide registration of the e-beam of a lithography tool to the given wafer stage 620, 622. In another embodiment, as shown in FIG. 6G, an e-beam/wafer alignment algorithm 682 may be carried out by the control system 670. In one embodiment, the control system 670 is communicatively coupled (not shown) to the one or more e-beam alignment sensors 636, the one or more wafer alignment sensors 638 and the interferometers of interferometer metrology system 650.

In one embodiment, as the stage is scanned under the e-beam 658, the position of the stage 620, 622 is measured by the interferometer system 650 associated with the given stage 620, 622. In another embodiment, when the e-beam traverses the e-beam alignment sensor 636 of a given stage 620, 622, the position of the e-beam relative to the stage interferometer 650 is measured by precise timing control between the interferometer measurement and the alignment sensor measurement. In a further embodiment, as shown in FIG. 6E, each short-stroke stage 620, 622 is further equipped with one or more wafer alignment sensors 638 (e.g., light sensing based wafer align sensor). In one aspect, each wafer alignment sensor 638 may be used to precisely locate the wafer 640 secured on a given stage 620, 622 relative to the alignment sensor 636. In one embodiment, the location of the wafer 640 relative to the alignment sensor 636 is determined by precisely controlling timing between the wafer alignment sensor 638 and the interferometer system 650 for the given stage 620, 622. In this sense, the e-beam alignment sensor 636 and one or more wafer alignment sensors 638 may allow for e-beam alignment with a wafer 640 disposed on a given short-stroke stage 620, 622 as frequently as every scan.

It is contemplated herein that the shape error recovery process, the measurement stitching process, and the e-beam/wafer registration process described herein may be carried out alone or in any combination.

In another embodiment, as shown in FIG. 6G, the control system 670 may be communicatively coupled to the electron beam deflection/focus system 684 of the lithography tool associated with a given stage 620, 622. In this regard, position errors measured by the metrology system 650 may be fed forward to the deflection/focus system 684 to provide real-time in-situ compensation of the lithography tool. In another embodiment, the control system 670 may be communicatively coupled to a display device 686 of a user interface. In this regard, position errors and other positional and interferometric data acquired by the control system 670 may be displayed to a user via the display device 686.

Figure 7A:
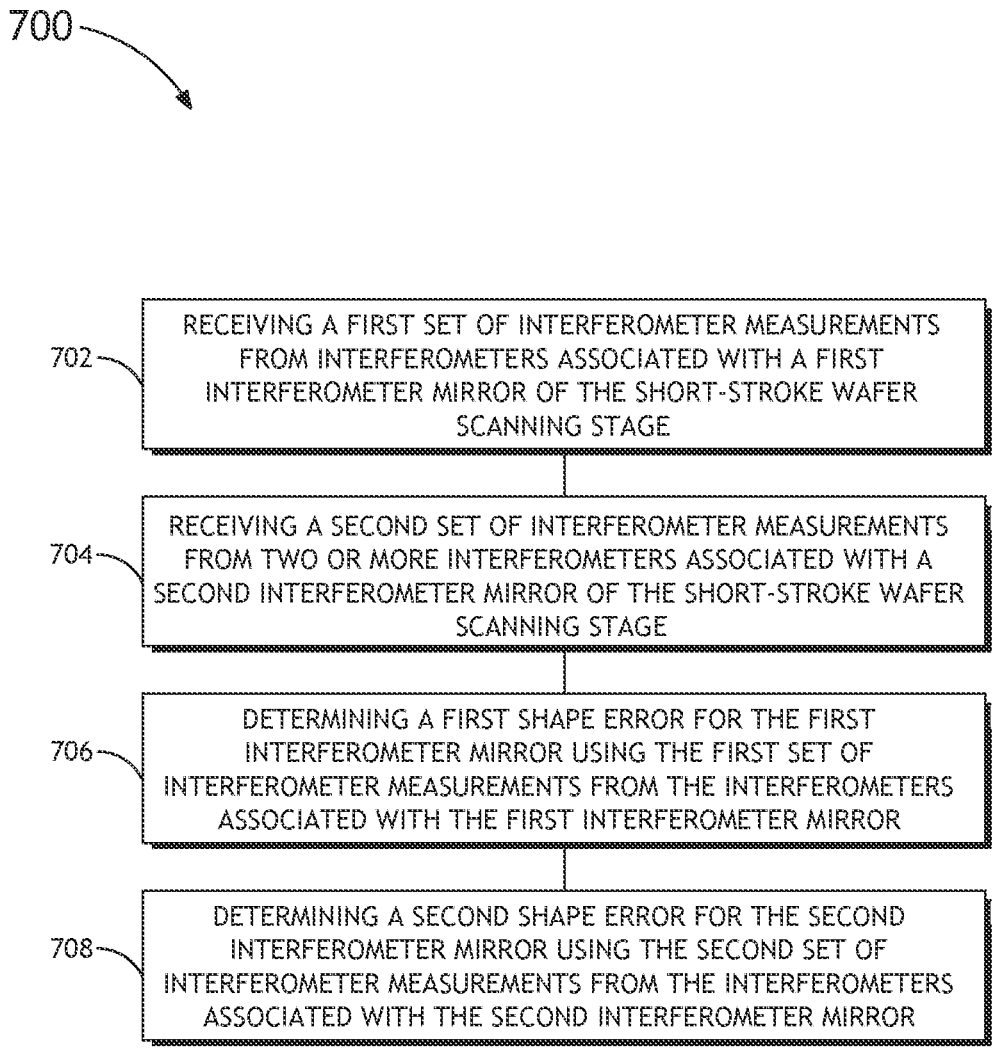
FIG. 7A is a process flow diagram of a method for shape error recovery of interferometer mirrors of an interferometry based metrology system of a short-stroke wafer scanning stage of a reflective electron beam lithography tool, in accordance with a preferred embodiment of the present invention.

FIG. 7A illustrates a process flow diagram of a method 700 for shape error recovery of interferometer mirrors of an interferometry based metrology system of a short-stroke wafer scanning stage of a reflective electron beam lithography tool, in accordance with one embodiment of the present invention. It is noted herein that the method 700 may be carried out utilizing any of the structural embodiments described throughout the present disclosure. It is further noted, however, that method 700 is not limited to the components or structural configurations described in the present disclosure as multiple equivalent components and/or configurations may be suitable for executing method 700.

At step 702, a first set of interferometer measurements from two or more interferometers associated with a first interferometer mirror of the short-stroke wafer scanning stage of an upper fast stage of a stacked stage wafer actuation system is received. For example, a first set of interferometer measurements from two or more interferometers (e.g., interferometers 661, 663 or 665) associated with an X mirror 652 disposed on a first edge surface of the short-stroke wafer scanning stage 620, 622 of an upper fast stage of a stacked stage wafer actuation system 600 is received by the one or more processors 672 of control system 670.

At step 704, a second set of interferometer measurements from two or more interferometers associated with a second interferometer mirror of the short-stroke wafer scanning stage of the upper fast stage of the stacked stage wafer actuation system is received. For example, a second set of interferometer measurements from two or more interferometers (e.g., interferometers 660, 662 or 664) associated with a Y/Z mirror 654 disposed on a second edge surface generally perpendicular to the first edge surface of the short-stroke wafer scanning stage 620, 622 of an upper fast stage of a stacked stage wafer actuation system 600 is received by the one or more processors 672 of control system 670.

At step 706, a first shape error for the first interferometer mirror is determined using the first set of interferometer measurements from the two or more interferometers associated with the first interferometer mirror. For example, a first shape error for the X mirror 652 is calculated using the first set of interferometer measurements from the two or more interferometers (e.g., interferometers 661, 663 or 663) associated with the X mirror 652. For instance, the shape error for the X mirror 652 is calculated using a shape error algorithm 678 executed by the one or more processors 672 of the control system 670.

At step 708, a second shape error for the second interferometer mirror is determined using the second set of interferometer measurements from the two or more interferometers associated with the second interferometer mirror. For example, a second shape error for the Y/Z mirror 654 is calculated using the second set of interferometer measurements from the two or more interferometers (e.g., interferometers 660, 662 or 664) associated with the Y/Z mirror. For instance, the shape error for the Y/Z mirror 654 is calculated using a shape error algorithm 678 executed by the one or more processors 672 of the control system 670. Applicant notes that the present invention may include calculating shape error for a single mirror.

FIG. 7B illustrates a process flow diagram of a method 700 for interferometry measurement stitching in an interferometry based metrology system of a short-stroke wafer scanning stage of a reflective electron beam lithography tool, in accordance with one embodiment of the present invention. It is noted herein that the method 720 may be carried out utilizing any of the structural embodiments described throughout the present disclosure. It is further noted, however, that method 720 is not limited to the components or structural configurations described in the present disclosure as multiple equivalent components and/or configurations may be suitable for executing method 720.

At step 722, a first set of interferometer measurements is received from two or more interferometers associated with a first interferometer mirror of the short-stroke wafer scanning stage of an upper fast stage of a stacked stage wafer actuation system. For example, a first set of interferometer measurements from two or more interferometers (e.g., interferometers 661, 663 or 665) associated with an X mirror 652 disposed on a first edge surface of the short-stroke wafer scanning stage 620, 622 of an upper fast stage of a stacked stage wafer actuation system 600 is received by the one or more processors 672 of control system 670.

At step 724, a second set of interferometer measurements is received from two or more interferometers associated with a second interferometer mirror of the short-stroke wafer scanning stage of the upper fast stage of the stacked stage wafer actuation system. For example, a second set of interferometer measurements from two or more interferometers (e.g., interferometers 660, 662 or 664) associated with a Y/Z mirror 654 disposed on a second edge surface generally perpendicular to the first edge surface of the short-stroke wafer scanning stage 620, 622 of an upper fast stage of a stacked stage wafer actuation system 600 is received by the one or more processors 672 of control system 670.

At step 726, a first interferometer measurement and at least an additional interferometer measurement of the first set of interferometer measurements associated with the first interferometer mirror are stitched together. For example, a first interferometer measurement from interferometer 661 and a second interferometer measurement from interferometer 663, both associated with the X mirror 652, are stitched together (e.g., stitched together using a bumpless transfer process).

At step 728, a first interferometer measurement and at least an additional interferometer measurement of the second set of interferometer measurements associated with the second interferometer mirror are stitched together. For example, a first interferometer measurement from interferometer 660 and a second interferometer measurement from interferometer 662, both associated with the Y/Z mirror 654, are stitched together (e.g., stitched together using a bumpless transfer process). Applicant notes that the present invention may include stitching together measurements associated with a single mirror.

Figure 7C:
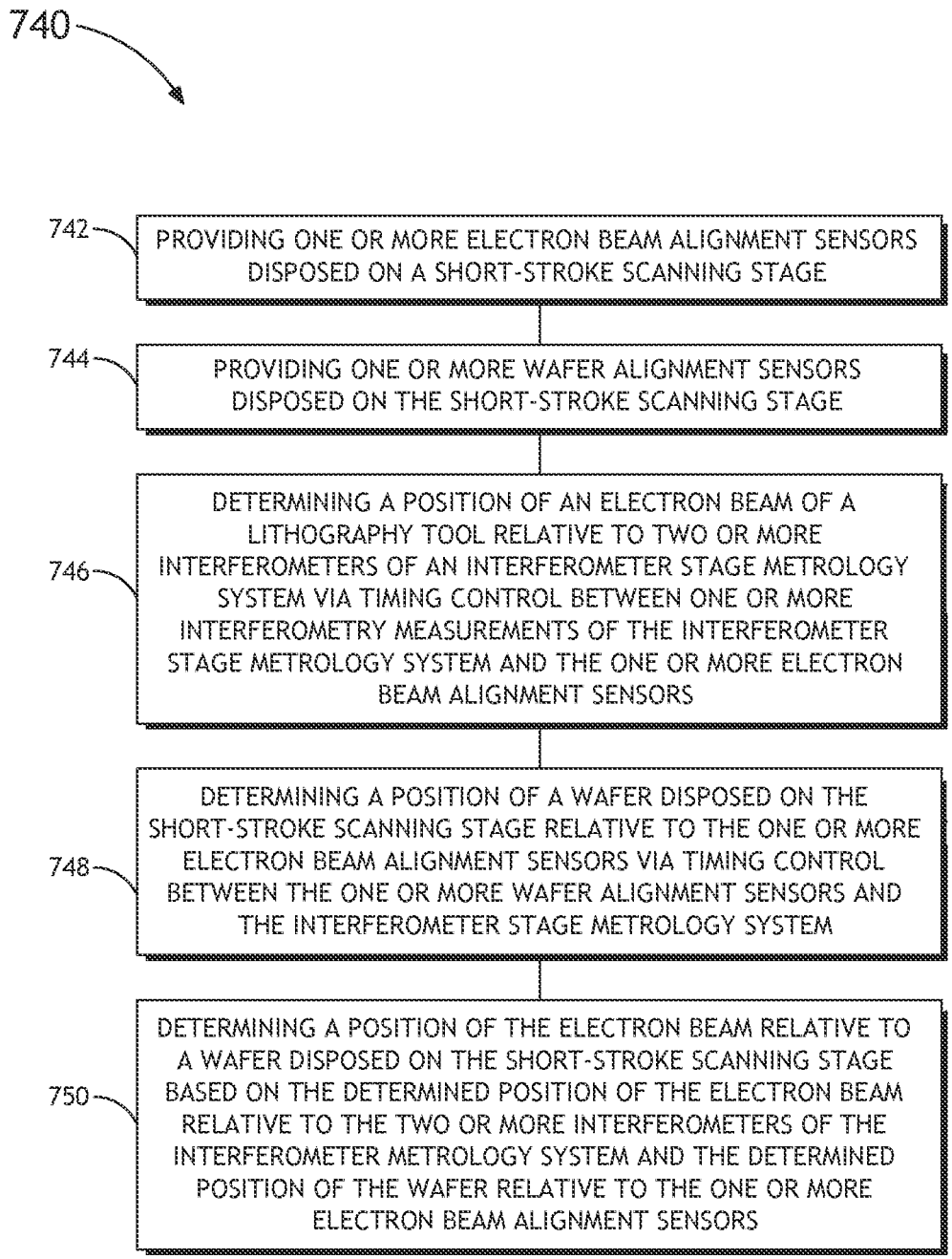
FIG. 7C is a process flow diagram of a method for electron beam alignment with a wafer on a short-stroke wafer scanning stage of a reflective electron beam lithography tool, in accordance with a preferred embodiment of the present invention.

FIG. 7C illustrates a process flow diagram of a method 700 for electron beam alignment with a wafer on a short-stroke wafer scanning stage of a reflective electron beam lithography tool, in accordance with one embodiment of the present invention. It is noted herein that the method 740 may be carried out utilizing any of the structural embodiments described throughout the present disclosure. It is further noted, however, that method 740 is not limited to the components or structural configurations described in the present disclosure as multiple equivalent components and/or configurations may be suitable for executing method 740.

At step 742, one or more electron beam alignment sensors disposed on a short-stroke wafer scanning stage of an upper fast stage of the stacked stage wafer actuation system is provided. Any sensor suitable for detecting an electron beam may be utilized in the present invention. At step 744, one or more wafer alignment sensors disposed on the short-stroke wafer scanning stage of the upper fast stage of the stacked stage wafer actuation system is provided.

At step 746, a position of an electron beam of a lithography tool is determined relative to two or more interferometers of an interferometer stage metrology system via timing control between one or more interferometry measurements of the interferometer stage metrology system and the one or more electron beam alignment sensors.

At step 748, a position of a wafer disposed on the short-stroke wafer scanning stage relative to the one or more electron beam alignment sensors is determined via timing control between the one or more wafer alignment sensors and the interferometer stage metrology system.

At step 750, a position of the electron beam relative to a wafer disposed on the short-stroke wafer scanning stage is determined based on the determined position of the electron beam relative to the two or more interferometers of the interferometer metrology system and the determined position of the wafer relative to the one or more electron beam alignment sensors.

Figure 8:
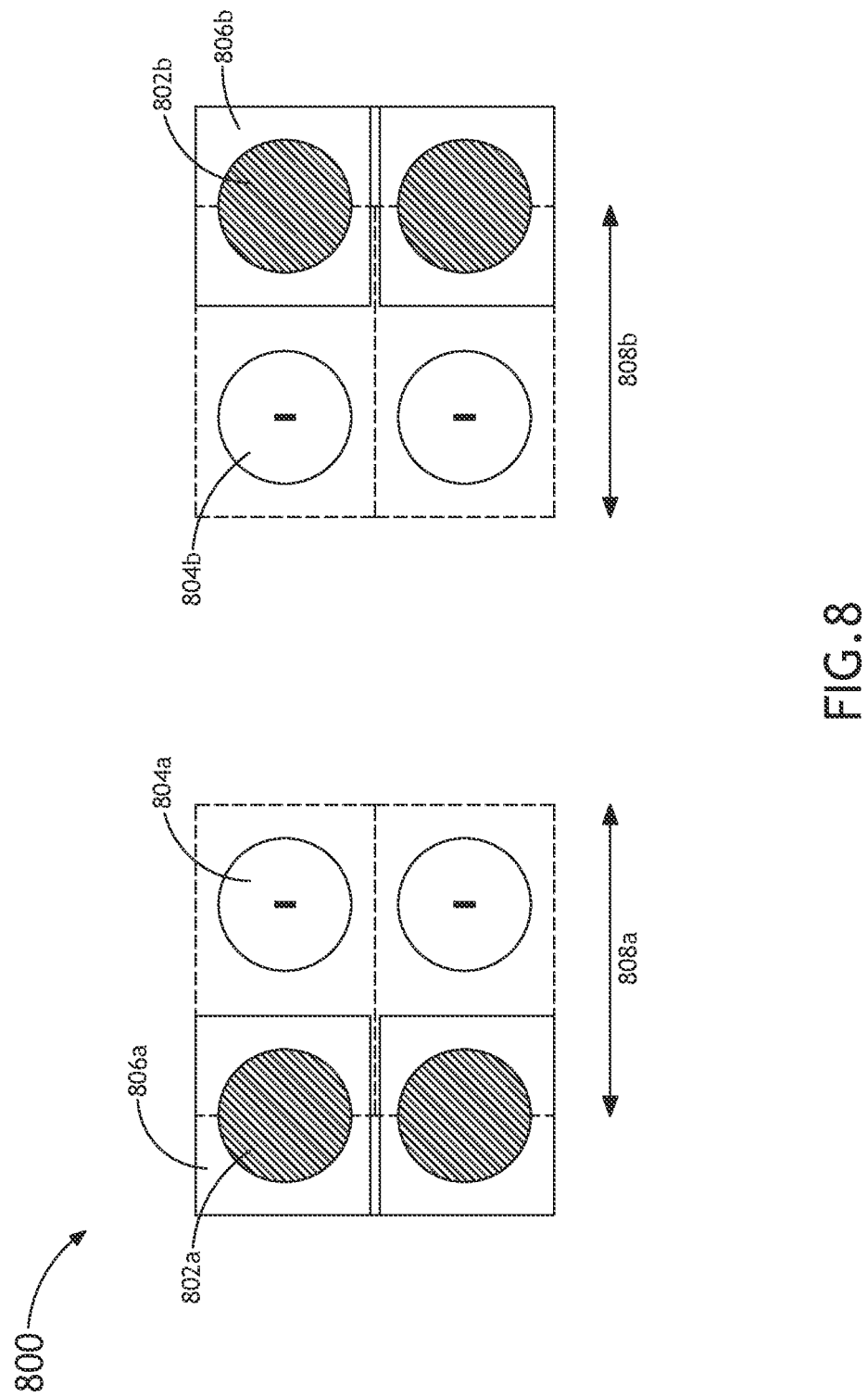
FIG. 8 is a top view of the wafer-electron optical column configuration for a REBL probe tool.

FIG. 8 illustrates a top view of the electron beam column configuration with respect to one or more wafers 802a, 802b actuated utilizing a stacked scanning stage 806a or 806b, in accordance with one embodiment of the present invention. It is noted herein that the configuration 800 depicted in FIG. 8 is a configuration suitable for implementation in a REBL probe tool setting with the interferometer stage metrology tool functionality and architecture described previously herein. In one aspect, the electron beam columns 804a, 804b are arranged in a one-to-one correspondence with the underlying wafers 802a, 802b. In this regard, the stacked scanning stages 806a, 806b are configured to move each wafer 802a, 802b under an electron optical column 804a, 804b of the system 800.

In a further embodiment, each stacked scanning stage 802a, 802b may include a first upper fast stage configured to translate a first wafer along at least one of a first axis and a second axis. For example, the first upper fast stage 806a may translate a first wafer 802a along at least one of a first axis (e.g., X-axis) or a second axis (e.g., Y-axis). For instance, the stage 806a may translate the first wafer 802a along the scanning direction 808a. In another embodiment, a second upper fast stage 806b is configured to translate a second wafer 802b along a scanning direction 808b. Further, the stacked scanning stage may include a carrier stage (not shown). In a further aspect, the first upper fast stage and the second upper fast stage may be disposed on an upper surface of the carrier stage, whereby the carrier stage is configured to translate at least one of the first upper fast stage and the second upper fast stage along at least one of the first axis and the second axis.

Figure 9:
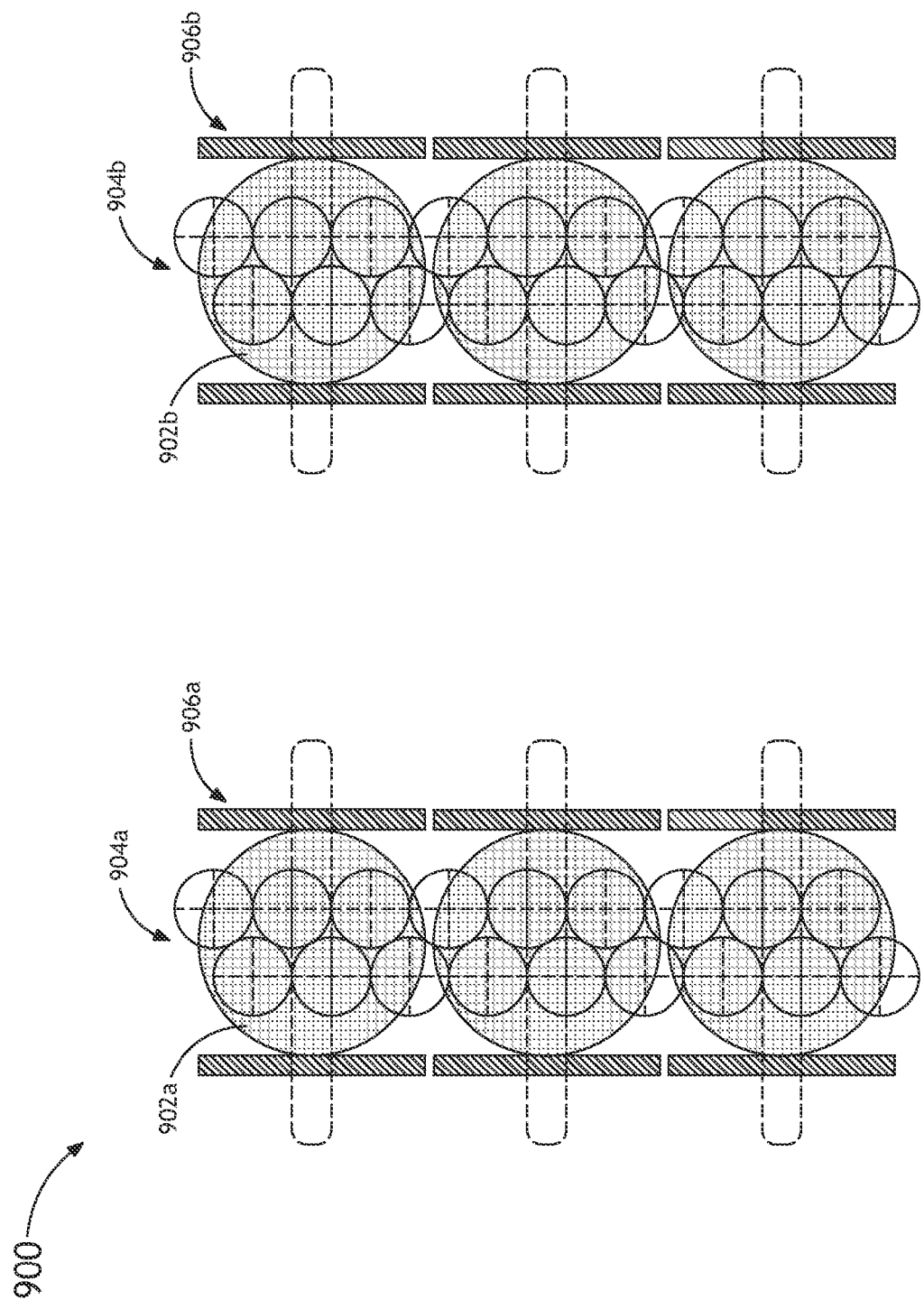
FIG. 9 is a top view of the wafer-electron optical column configuration for a REBL production tool.

FIG. 9 illustrates a top view of a multiple electron beam column configuration of a REBL production tool with respect to one or more wafers 902a, 902b actuated utilizing a stacked scanning stage 906a or 906b, in accordance with one embodiment of the present invention. It is noted herein that the configuration 900 depicted in FIG. 9 is a configuration suitable for implementation in a REBL production tool setting, such as a high volume manufacturing (HVM) tool, along with the interferometer stage metrology tool functionality and architecture described previously herein. In one aspect, the electron beam columns 904a, 904b are arranged such that each wafer is scanned simultaneously with multiple electron beam columns. For example, as shown in FIG. 9, each wafer may correspond with six tightly arranged electron beam columns. In this regard, the stacked scanning stages 906a, 906b are configured to move each wafer 902a, 902b under a set of electron optical columns 904a, 904b of the system 900.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An interferometer stage metrology system with interferometer mirror shape error recovery, comprising:

an interferometer stage metrology system configured to interferometrically measure the position of a short-stroke wafer scanning stage of on an upper fast stage of a stacked stage wafer actuation system along at least one of a first axis, a second axis and a third axis, wherein the interferometer stage metrology system is further configured to interferometrically measure rotation of the short-stroke wafer scanning stage about at least one of the first axis, the second axis and the third axis, wherein the interferometer metrology system includes two or more interferometers for each axis, wherein a first interferometer mirror is disposed on a first surface of the short-stroke wafer scanning stage and a second interferometer mirror is disposed on a second surface of the short-stroke wafer scanning stage;

a control system communicatively coupled to each of the interferometers of the interferometer metrology system, wherein the control system is configured to determine a shape error for the first interferometer mirror using two or more interferometer measurements from the two or more interferometers associated with the first interferometer mirror and a shape error for the second interferometer mirror using two or more interferometer measurements from the two or more interferometers associated with the second interferometer mirror.

2. The system of claim 1, wherein the short-stroke wafer scanning stage comprises:
a short-stroke wafer scanning stage of an electron beam lithography tool.

3. The system of claim 2, wherein the electron beam lithography tool comprises:
a reflective electron beam lithography tool.

4. The system of claim 1, wherein the first interferometer mirror is configured for measurement along the X-direction.

5. The system of claim 1, wherein the first interferometer mirror is configured for measurement along at least one of the Y and Z directions.

6. The system of claim 1, wherein the short-stroke wafer scanning stage comprises:
a magnetic levitation stage.

7. The system of claim 6, wherein the magnetic levitation stage comprises:
a magnetic levitation stage controlled utilizing one or more Lorentz motors.

8. The system of claim 1, wherein the short-stroke wafer scanning stage is configured to translate a wafer along at least one of a first axis, a second axis and a third axis, wherein the first axis, the second axis, and the third axis are mutually perpendicular.

9. An interferometer stage metrology system with interferometry measurement stitching, comprising:
an interferometer stage metrology system configured to interferometrically measure the position of a short-stroke wafer scanning stage of on an upper stage of a stacked stage wafer actuation system along at least one of a first axis, a second axis and a third axis, wherein the interferometer stage metrology system is further configured to interferometrically measure rotation of the short-stroke wafer scanning stage about at least one of the first axis, the second axis and the third axis, wherein the interferometer metrology system includes two or more interferometers for each axis, wherein a first interferometer mirror is disposed on a first surface of the short-stroke wafer scanning stage and a second interferometer mirror is disposed on a second surface of the short-stroke wafer scanning stage;
a control system communicatively coupled to each of the interferometers of the interferometer metrology system, wherein the control system is configured to stitch together measurements from two or more interferometers associated with the first interferometer mirror and stitch together measurements from two or more interferometers associated with the second interferometer mirror.

10. The system of claim 9, wherein the short-stroke wafer scanning stage comprises:
a short-stroke wafer scanning stage of an electron beam lithography tool.

11. The system of claim 10, wherein the electron beam lithography tool comprises:
a reflective electron beam lithography tool.

12. The system of claim 9, wherein the control system is configured to apply a bumpless transfer process to stitch together measurements from two or more interferometers associated with the first interferometer mirror and stitch together measurements from two or more interferometers associated with the second interferometer mirror.

13. The system of claim 9, wherein the first interferometer mirror is configured for measurement along the X-direction.

14. The system of claim 9, wherein the first interferometer mirror is configured for measurement along at least one of the Y and Z directions.

15. The system of claim 9, wherein the short-stroke wafer scanning stage comprises:
a magnetic levitation stage.

16. The system of claim 15, wherein the magnetic levitation stage comprises:
a magnetic levitation stage controlled utilizing one or more Lorentz motors.

17. The system of claim 9, wherein the short-stroke wafer scanning stage is configured to translate a wafer along at least one of a first axis, a second axis and a third axis, wherein the first axis, the second axis, and the third axis are mutually perpendicular.

18. An interferometer stage metrology system with electron beam and wafer alignment capabilities, comprising:
an interferometer stage metrology system configured to interferometrically measure the position of a short-stroke wafer scanning stage of on an upper fast stage of a stacked stage wafer actuation system along at least one of a first axis, a second axis and a third axis, wherein the interferometer stage metrology system is further configured to interferometrically measure rotation of the short-stroke wafer scanning stage about at least one of the first axis, the second axis and the third axis, wherein the interferometer metrology system includes two or more interferometers for each axis, wherein a first interferometer mirror is disposed on a first surface of the short-stroke wafer scanning stage and a second interferometer mirror is disposed on a second surface of the short-stroke wafer scanning stage;
one or more electron beam alignment sensors disposed on the short-stroke wafer scanning stage of the upper fast stage;
one or more wafer alignment sensors disposed on the short-stroke wafer scanning stage of the upper fast stage;
a control system communicatively coupled to the one or more electron beam alignment sensors, the one or more wafer alignment sensors and the interferometer metrology system, the control system further configured to:
determine the position of the electron beam relative to the two or more interferometers of the interferometer metrology system via timing control between one or more interferometry measurements of the interferometer stage metrology system and the one or more electron beam alignment sensors;
determine a position of a wafer disposed on the short-stroke wafer scanning stage relative to the one or more electron beam alignment sensors via timing control between the one or more wafer alignment sensors and the interferometer metrology system; and determine a position of the electron beam relative to a wafer disposed on the short-stroke wafer scanning stage based on the determined position of the electron beam relative to the two or more interferometers of the interferometer metrology system and the position of the wafer relative to the one or more electron beam alignment sensors.

19. The system of claim 18, wherein the short-stroke wafer scanning stage comprises:

a short-stroke wafer scanning stage of an electron beam lithography tool.

20. The system of claim 19, wherein the electron beam lithography tool comprises:

a reflective electron beam lithography tool.

21. The system of claim 18, wherein the control system is further configured to:

provide a position of the electron beam relative to the wafer to a lithography tool in order to provide alignment correction between the electron beam of the lithography tool and the wafer.

22. The system of claim 21, wherein the control system is configured to provide a position of the electron beam relative to the wafer to a deflection and focus system of the lithography tool in order to provide alignment correction between the electron beam of the lithography tool and the wafer.

23. The system of claim 18, wherein the first interferometer mirror is configured for measurement along the X-direction.

24. The system of claim 18, wherein the first interferometer mirror is configured for measurement along at least one of the Y and Z directions.

25. The system of claim 18, wherein the short-stroke wafer scanning stage comprises:

a magnetic levitation stage.

26. The system of claim 25, wherein the magnetic levitation stage comprises:

a magnetic levitation stage controlled utilizing one or more Lorentz motors.

27. The system of claim 18, wherein the short-stroke wafer scanning stage is configured to translate a wafer along at least one of a first axis, a second axis and a third axis, wherein the first axis, the second axis, and the third axis are mutually perpendicular.

28. A method for shape error recovery of interferometer mirrors of an interferometry based metrology system of a short-stroke wafer scanning stage of a reflective electron beam lithography tool, comprising:

receiving a first set of interferometer measurements from two or more interferometers associated with a first interferometer mirror of the short-stroke wafer scanning stage of an upper fast stage of a stacked stage wafer actuation system;

receiving a second set of interferometer measurements from two or more interferometers associated with a second interferometer mirror of the short-stroke wafer scanning stage of the upper fast stage of the stacked stage wafer actuation system;

determining a first shape error for the first interferometer mirror using the first set of interferometer measurements from the two or more interferometers associated with the first interferometer mirror; and determining a second shape error for the second interferometer mirror using the second set of interferometer measurements from the two or more interferometers associated with the second interferometer mirror.

29. A method for interferometry measurement stitching in an interferometry based metrology system of a short-stroke wafer scanning stage of a reflective electron beam lithography tool, comprising:

receiving a first set of interferometer measurements from two or more interferometers associated with a first interferometer mirror of the short-stroke wafer scanning stage of an upper fast stage of a stacked stage wafer actuation system;

receiving a second set of interferometer measurements from two or more interferometers associated with a second interferometer mirror of the short-stroke wafer scanning stage of the upper fast stage of the stacked stage wafer actuation system;

stitching together a first interferometer measurement and at least an additional interferometer measurement of the first set of interferometer measurements associated with the first interferometer mirror; and stitching together a first interferometer measurement and at least an additional interferometer measurement of the second set of interferometer measurements associated with the second interferometer mirror.

30. A method for electron beam alignment with a wafer on a short-stroke wafer scanning stage of a reflective electron beam lithography tool, comprising:

providing one or more electron beam alignment sensors disposed on a short-stroke wafer scanning stage of an upper fast stage of the stacked stage wafer actuation system;

providing one or more wafer alignment sensors disposed on the short-stroke wafer scanning stage of the upper fast stage of the stacked stage wafer actuation system;

determining a position of an electron beam of a lithography tool relative to two or more interferometers of an interferometer stage metrology system via timing control between one or more interferometry measurements of the interferometer stage metrology system and the one or more electron beam alignment sensors;

determining a position of a wafer disposed on the short-stroke wafer scanning stage relative to the one or more electron beam alignment sensors via timing control between the one or more wafer alignment sensors and the interferometer stage metrology system; and determining a position of the electron beam relative to a wafer disposed on the short-stroke wafer scanning stage based on the determined position of the electron beam relative to the two or more interferometers of the interferometer metrology system and the determined position of the wafer relative to the one or more electron beam alignment sensors.

* * * * *